(12) United States Patent
Sato

(10) Patent No.: US 7,299,965 B2
(45) Date of Patent: Nov. 27, 2007

(54) METHOD AND APPARATUS FOR MOUNTING AND REMOVING AN ELECTRONIC COMPONENT

(75) Inventor: Toshihisa Sato, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/288,279

(22) Filed: Nov. 29, 2005

(65) Prior Publication Data

US 2006/0076388 A1    Apr. 13, 2006

Related U.S. Application Data

(63) Continuation of application No. PCT/JP03/06748, filed on May 29, 2003.

(51) Int. Cl.
*B23K 31/00* (2006.01)
*B23K 1/018* (2006.01)

(52) U.S. Cl. .............. 228/180.22; 228/191; 228/233.2; 228/234.1; 228/264

(58) Field of Classification Search .......... 228/180.22, 228/191, 264
See application file for complete search history.

(56) References Cited

U.S. PATENT DOCUMENTS

| | | | |
|---|---|---|---|
| 4,954,453 A * | 9/1990 | Venutolo ................. | 29/592 |
| 6,503,336 B1 * | 1/2003 | Barr ........................ | 134/34 |
| 2003/0034380 A1 * | 2/2003 | Kimura et al. .......... | 228/125 |
| 2004/0206805 A1 * | 10/2004 | Kimura et al. .......... | 228/264 |

FOREIGN PATENT DOCUMENTS

| | | |
|---|---|---|
| JP | 5-335377 | 12/1993 |
| JP | 6-21147 | 1/1994 |
| JP | 8-130231 | 5/1996 |
| JP | 10-294558 | 11/1998 |
| JP | 11-112131 | 4/1999 |
| JP | 11-297764 | 10/1999 |
| JP | 2000-332060 | 11/2000 |
| JP | 2001-7157 | 1/2001 |
| JP | 2001-210946 | 8/2001 |
| JP | 2002-57453 | 2/2002 |
| JP | 2002-110740 | 4/2002 |
| JP | 2002-164648 | 6/2002 |
| JP | 2003-31619 | 1/2003 |

* cited by examiner

*Primary Examiner*—Kiley Stoner
(74) *Attorney, Agent, or Firm*—Staas & Halsey LLP

(57) ABSTRACT

A method and an apparatus are provided for mounting and removing electronic components using solder bumps while constraining thermal stresses to a substrate. The method and apparatus for mounting and removing an electronic component (bear chip 32) to be soldered onto the substrate with solder bumps 114 is configured to move the electronic component to detect contact of the solder bumps with the substrate or contact of a tool (chuck unit 38) with the electronic component, to define the contact as an original point for raising a heating temperature of the electronic component and the substrate from the heating temperature to a maximum heating temperature HTm as well as move the electronic component in conformity with the temperature rising, and to move the electronic component from a position where the maximum heating temperature is achieved to a mounting height of the substrate.

6 Claims, 19 Drawing Sheets

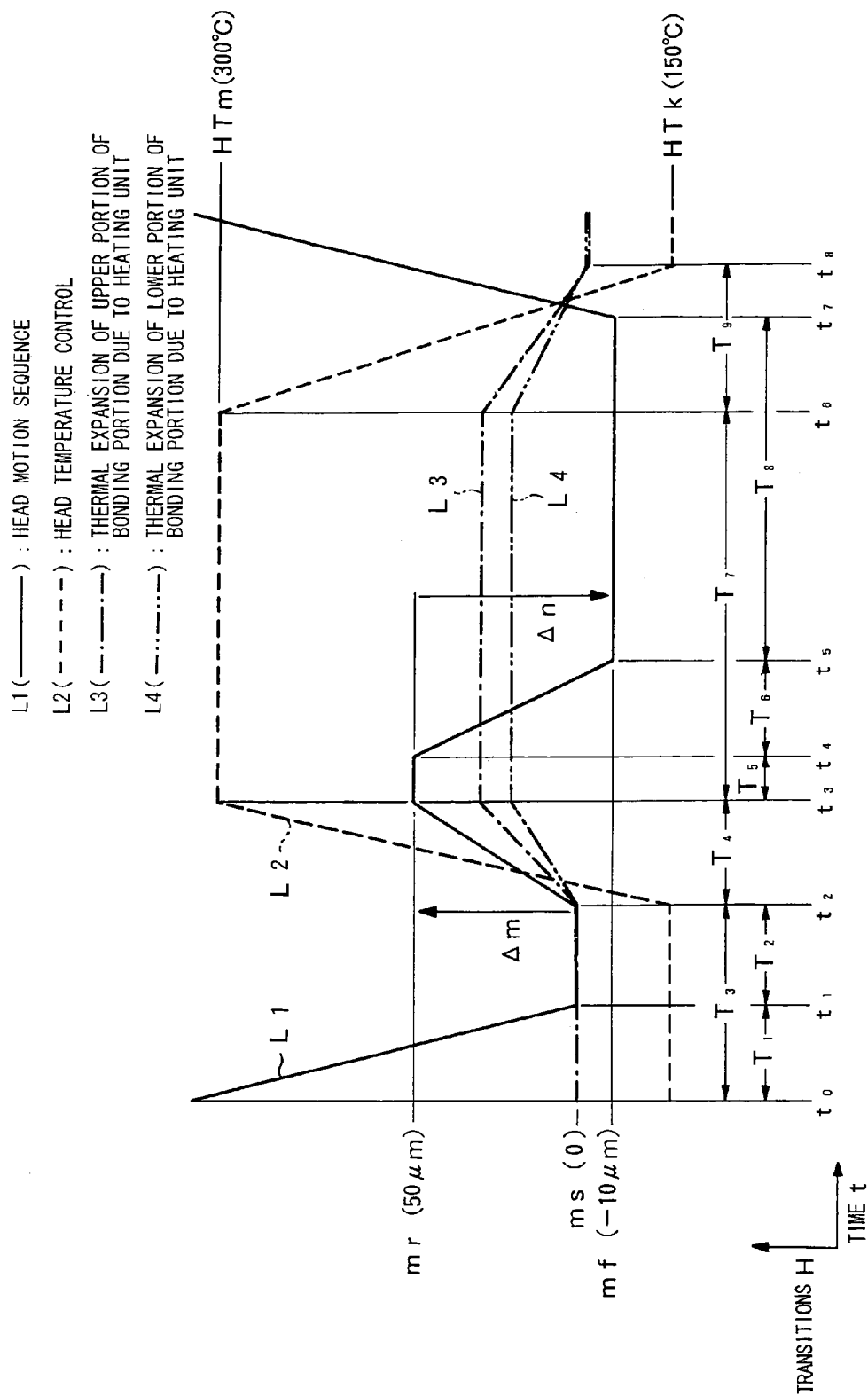

FIG.11A
FIG.11B
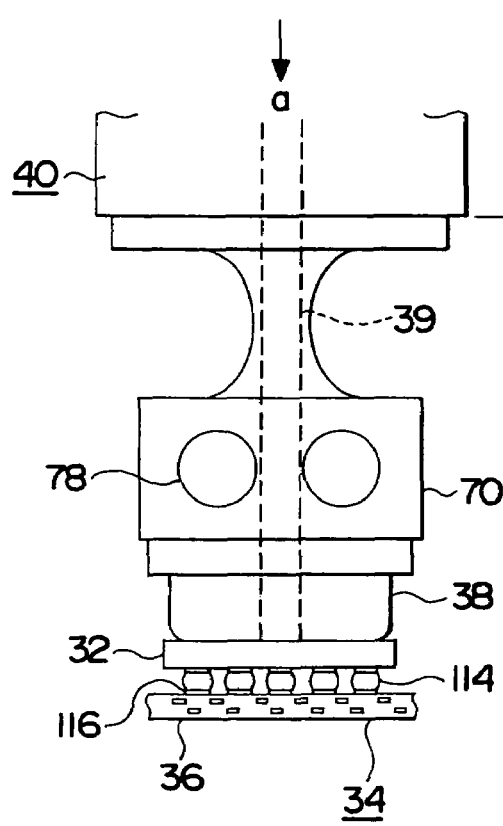
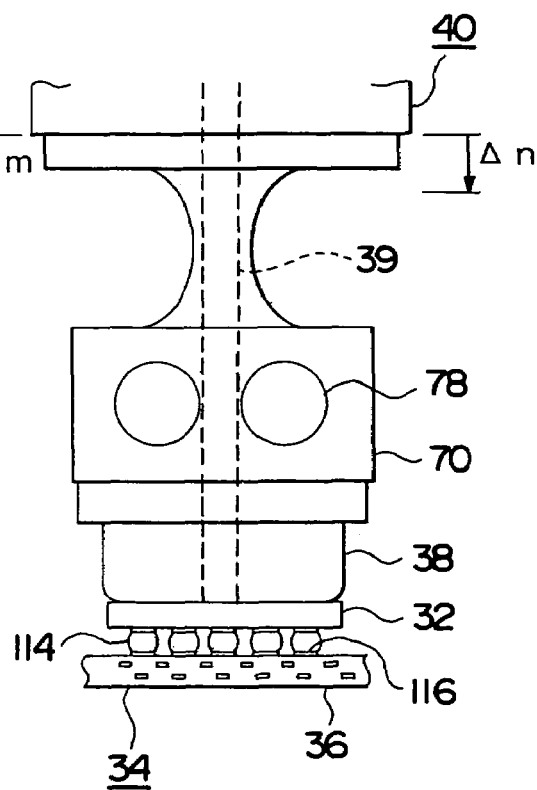

METHOD AND APPARATUS FOR MOUNTING AND REMOVING AN ELECTRONIC COMPONENT

CROSS-REFERENCE TO RELATED APPLICATIONS

This application is a continuation of International Application No. PCT/JP03/06748, filed on May 29, 2003, now pending, herein incorporated by reference.

BACKGROUND OF THE INVENTION

1. Field of the Invention

The present invention relates generally to a method and an apparatus for mounting and removing semiconductor devices such as bear chips, flip chip components and other various electronic components connected to a substrate with solder bumps and, more particularly, to a method and an apparatus for mounting and removing electronic components suitable for various processing such as reworking, replacing and repairing bear chips mounted on a resin substrate with the use of solder bumps.

As a mounting technology for bear chips, the C4 (Controlled Collapse Chip Connection) flip chip wiring technology is used and, in this C4 flip chip wiring technology, connecting protruding terminals (micro bumps) are formed with narrowed connection pitches on a LSI (Large Scale Integration) chip or a flip chip component which is mounted on a module substrate with these micro bumps. For bear chips, various processing can be performed, such as mounting, removing, replacing, remounting and the like. The present invention relates to a method and an apparatus for mounting and removing electronic components, which are preferred for mounting electronic components such as the bear chips onto a resin substrate and for various processing such as rework processing, replace processing, repair processing and the like thereof.

2. Description of the Related Art

Conventionally, in rework of a bear chip, a bonding head of a reflow apparatus is positioned to the bear chip mounted on a substrate and the bear chip is detached from the substrate by heating and melting solder with the bonding head. On the substrate after the bear chip is removed, residual solder is heated and removed and the substrate is processed to be in a state equivalent to the state before mounting by performing cleaning processing with a solvent. Then, the bear chip is positioned and fixed at a bear-chip mounting position on the substrate and the bear chip is remounted by heating the entire package (PKG) with a reflow oven for reflow processing.

For this conventional rework, for example, referring to FIGS. 1A to 1C and FIGS. 2A to 2C, FIGS. 1A to 1C show processing for removing a bear chip from a substrate, and FIGS. 2A to 2C show remount processing after the bear chip is removed. As indicated by an arrow a of FIG. 1A, a tool head 8 is positioned and lowered to a bear chip 6 mounted on a substrate 2 with C4 bumps, for example, solder bumps 4 and, as indicated by an arrow b of FIG. 1B, a top surface of the bear chip 6 is contacted with an under surface of the tool head 8, and the solder bumps 4 is heated and melted by the tool head 8 and the like while controlling the pressure thereof. While maintaining this melting state, as indicated by an arrow c of FIG. 1C, the bear head is supported by the tool head 8 and, when the tool head 8 is raised, the bear chip 6 is detached from the substrate and the solder bumps 4 are melted and collapsed on the substrate to become residual solder 10. The residual solder 10 is in a short-circuit state. Therefore, after the residual solder 10 is removed with the use of a jig 12 as shown in FIG. 2A, preliminary solder bumps 14 is formed on the substrate 2 at a mounting position of the bear chip 6 as shown in FIG. 2B, and the bear chip 6 is positioned at the mounting position to be reconnected.

Regarding to such rework of bear chips and mounting technologies using solder bumps, prior patent documents exist, which are Japanese Patent Application Laid-Open Publication Nos. H06(1994)-21147, H10(1998)-294558, H11(1999)-112131, 2001-7157, 2002-57453, 2002-110740 and others.

Japanese Patent Application Laid-Open Publication No. H06(1994)-21147 discloses mounting, removing and remounting of flip chip IC with the use of solder bumps; Japanese Patent Application Laid-Open Publication No. H10(1998)-294558 discloses a rework apparatus for removing semiconductor devices by heating a semiconductor apparatus with the semiconductor devices mounted on a substrate; Japanese Patent Application Laid-Open Publication No. H11(1999)-112131 discloses a method for removing a semiconductor apparatus wherein the semiconductor apparatus is removed by heating and melting solder from a substrate where the semiconductor apparatus has been mounted, and a method for repairing a semiconductor apparatus wherein a semiconductor apparatus is positioned and remounted onto a substrate where the semiconductor apparatus has been removed; Japanese Patent Application Laid-Open Publication No. 2001-7157 discloses repair processing of flip chip mounting; Japanese Patent Application Laid-Open Publication No. 2002-57453 discloses a method for repairing a semiconductor apparatus wherein after a semiconductor apparatus is removed from a substrate by heating the semiconductor apparatus mounted onto the substrate, the semiconductor apparatus is remounted by supplying solder paste for forming preliminary solder, by affixing the semiconductor apparatus onto the preliminary solder and by heating and melting the solder for bonding; and Japanese Patent Application Laid-Open Publication No. 2002-110740 discloses a method and an apparatus for mounting wherein, in a mounting method for lowering a semiconductor apparatus with solder bumps formed on a under surface of a semiconductor device for flip chip bonding on a substrate, a gap between the semiconductor device and the substrate is controlled depending on the height of the semiconductor apparatus.

By the way, in removal of an electronic component in conventional rework processing of various electronic components such as bear chips, pressure control is used for position control of a head unit equipped on a tool. If a bonding portion of a bear chip has narrow gaps, when an error occurs in the position control of the tool, solder may be short-circuited and the residual solder in the short-circuit state must be removed by sufficient cleaning processing before replacing the bear chip. If a bonding portion of a bear chip has narrow gaps, sufficient accuracy is required for the position control of a substrate and the bear chip at the time of mounting in order to enhance reliability of connection.

Although the preliminary-solder processing is used for ensuring connectivity between the substrate and bear chip, thermal stresses are accumulated in the substrate due to the preliminary-solder processing and the reliability of the connection may be reduced.

Also, since the reflow processing of the entire package gives great thermal stresses to the substrate, if a member with limited heat resistance is mounted on the package, reprocessing is difficult and inspection costs are increased for such as the failure analysis of the bear chips at the time of mounting.

These problems cannot be solved by technologies disclosed in the prior patent documents described above.

SUMMARY OF THE INVENTION

The present invention relates to a method and an apparatus for mounting and removing electronic components, which are preferred for mounting electronic components such as the bear chips onto a resin substrate and for various processing such as rework processing, replace processing, repair processing and the like thereof and the present invention is intended to provide a method and an apparatus for mounting and removing electronic components, which solve the problems described above.

More particularly, an object of the present invention is to provide a method and an apparatus for mounting and removing electronic components, which can constrain thermal stresses generated on a substrate. Another object of the present invention is to provide a method and an apparatus for removing electronic components, which enable reuse of residual solder.

In order to achieve the above objects, according to a first aspect of the present invention there is provided a mounting method for an electronic component to be soldered onto a substrate via solder bumps, the mounting method comprising the steps of moving the electronic component to detect contact of the solder bumps with the substrate; raising a heating temperature of the electronic component and the substrate up to a maximum heating temperature starting from the contact as well as moving the electronic component responding to the temperature rising; and moving the electronic component from a position where the maximum heating temperature is achieved to a mounting height of the substrate.

According to such a configuration, the original point is defined as a position where the solder bumps of the electronic component contact the substrate, and the temperatures of the electronic component and the substrate can be matched at the original point by the contact of the electronic component and the substrate. For example, identical temperatures can be set by preheating. If this position is defined as original point and if the electronic component is moved in conformity with the rise in temperature, heating to the maximum heating temperature can be achieved with the contact state of both maintained, while absorbing a total amount of thermal deformation. If the electronic component is moved from the position where the maximum heating temperature is achieved to the mounting height of the substrate, the maximum heating temperature is maintained and the positions of the solder bumps of the electronic component are optimized relative to the substrate. By using the movement control and the heating control of the electronic component at the same time in this way, a heating loss is constrained at the bonding portion of the electronic component and substrate.

The electronic component may be retained at a position where the heating temperature attains the maximum heating temperature, and the electronic component may be moved to the mounting height of the substrate after the elapse of predetermined time. The solder is ensured to be melted by holding at the position where the maximum heating temperature is achieved and the electronic component can be moved from the position to the optimum mounting height to be mounted onto the substrate.

The amount of movement of the electronic component moved responding to the temperature rising may be a value calculated from thermal distortion of the substrate and thermal distortion of support members supporting the electronic component. According to such a configuration, by moving the electronic component, the thermal deformation is absorbed on the substrate side and on the side of the support member supporting the electronic component; the positions of the solder bumps of the electronic component are planned to be optimized relative to the substrate; and a heat conduction loss is constrained.

In order to achieve the above objects, according to a second aspect of the present invention there is provided a removing method for an electronic component soldered to a substrate with the use of solder bumps, the removing method comprising the steps of moving a tool to detect contact of the tool with the electronic component on the substrate; with the contact as an original point, raising a heating temperature of the electronic component and the substrate up to a maximum heating temperature as well as moving the tool responding to the temperature rising; and moving the electronic component from a position where the maximum heating temperature is achieved to a mounting height of the substrate through movement of the tool so that the tool receives the electronic component from the substrate.

According to such a configuration, the original point is defined as a position where the tool contacts the electronic component on the substrate, and the temperatures of the electronic component and the substrate can be matched at the original point by the contact of the electronic component and the substrate. The heating temperature is raised from the original point and the tool is moved in conformity with the rise in temperature. This movement absorbs a total amount of thermal deformation; the electronic component is moved from the position of the maximum heating temperature to the mounting height of the substrate by the tool; and the electronic component is received by the tool from the substrate. By using the position control with the movement of the tool and the heating control at the same time in this way, the position of the electronic component is optimized relative to the substrate through the tool; a heating loss is constrained at the bonding portion of the electronic component and substrate; and the reusable residual solder is formed on the substrate.

The tool may be stopped at a position where the heating temperature attains the maximum heating temperature and the electric component may be moved to the mounting height of the substrate by use of the tool after the elapse of predetermined time. The amount of movement of the tool moved responding to the temperature rising may be a value calculated from thermal distortion of the substrate and thermal distortion of support members supporting the electronic component.

Preferably, 30 to 50 percent of solder is left on the substrate with the electronic component removed. By forming such residual solder, the short circuit due to the solder is prevented and the solder can be reused as the bonding portion.

In order to achieve the above objects, according to a third aspect of the present invention there is provided a mounting method for an electronic component to be removed from a substrate and remounted onto the portion of the substrate where the removal has been made, wherein the removing of the electronic component from the substrate includes leaving 30 to 50 percent of solder on the portion of the substrate from which the electronic component has been removed and using the residual solder for remounting the electronic component.

In order to achieve the above objects, according to a fourth aspect of the present invention there is provided a mounting apparatus for an electronic component to be mounted onto a substrate via solder bumps, the mounting apparatus comprising a movement mechanism moving the electronic component; a heating unit heating the electronic component or the substrate; a contact detection unit detecting contact of the solder bumps of the electronic component with the substrate; and a control unit moving the electronic component via the movement mechanism, the control unit raising a heating temperature of the heating unit for the electronic component and the substrate up to a maximum heating temperature starting from the detection of contact by the contact detection unit as well as moving the electronic component responding to the temperature rising through the movement mechanism, the control unit moving the electronic component from a position where the maximum heating temperature is achieved to a mounting height of the substrate.

According to such a configuration, the original point is defined as a position where the solder bumps of the electronic component contact the substrate during the movement of the electronic component; the heating temperature of the electronic component and substrate is raised from the original point position; the electronic component can be moved in conformity with the rise in temperature; the electronic component is controlled to the mounting height of the substrate from the position where the maximum heating temperature is achieved; the positions of the solder bumps of the electronic component can be optimized relative to the substrate; and a heating loss can be constrained at the bonding portion of the electronic component and substrate.

In order to achieve the above objects, according to a fifth aspect of the present invention there is provided a removing apparatus for an electronic component mounted on a substrate with the use of solder bumps, the removing apparatus comprising a heating unit heating a tool supporting the electronic component or heating at least a soldered portion of the electronic component; a contact detection unit detecting contact of the tool with the electronic component on the substrate; a movement mechanism for moving the tool; and a control unit moving the tool via the movement mechanism to detect the contact by use of the contact detection unit, the control unit raising a heating temperature for the electronic component and the substrate via the heating unit up to a maximum heating temperature starting from the contact, the control unit moving the tool via the movement mechanism responding to the temperature rising, the control unit moving the electronic component through movement of the tool from a position where the maximum heating temperature is achieved to a mounting height of the substrate so that the tool receives the electronic component from the substrate. The apparatus with such a configuration for removing the electronic component is used for implementing the method for removing the electronic component described above.

The advantages and features of the present invention are listed as follows.

According to the method for mounting the electronic component of the present invention, by using the heating control and the position control of the electronic component at the same time, the component such as the semiconductor apparatus can be mounted or remounted without generating stresses to the substrate; Preprocessing can be skipped for a package with a low heat resistant component mounted onto the same package; and the stresses and costs can be reduced while reliability can be enhanced.

Also, according to the method for removing the electronic component of the present invention, by using the heating control and the position control of the electronic component at the same time, the reusable solder can be formed on the substrate without generating stresses to the substrate.

According to the apparatus for mounting the electronic component of the present invention, the electronic component such as the semiconductor apparatus can be mounted or remounted with one-time heating without generating stresses to the substrate.

Also, according to the apparatus for removing the electronic component of the present invention, the electronic component can be removed with one-time heating without generating stresses to the substrate, and the residual solder in the reusable state can be formed, which contributes to simplification of preprocessing and the like to enable fast and easy remounting.

Other objects, features and advantages of the present invention will become apparent with reference to the accompanying drawings and embodiments.

BRIEF DESCRIPTION OF THE DRAWINGS

FIG. 10 is a diagram showing an operation sequence of the head unit, temperature control of the head unit, and thermal expansion of upper and lower portions of a bonding portion in reflow processing and remove processing;

FIGS. 11A and 11B are diagrams showing rising and lowering motion of the head unit in reflow processing and remove processing;

DESCRIPTION OF THE PREFERRED EMBODIMENTS

First Embodiment

Figure 1A:
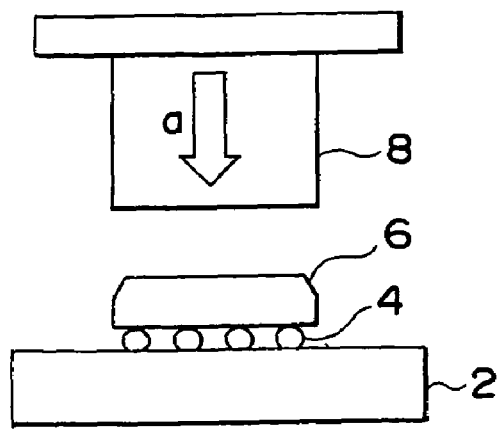
FIGS. 1A, 1B and 1C are diagrams showing a conventional bear-chip rework method.
Figure 1B:
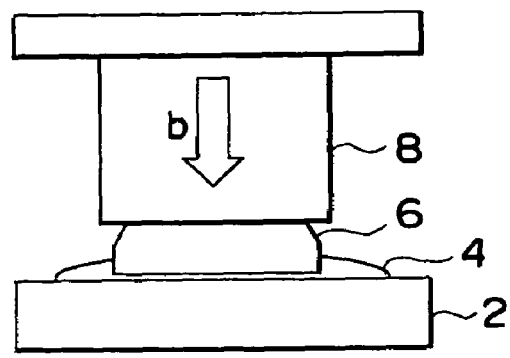
Figure 1C:
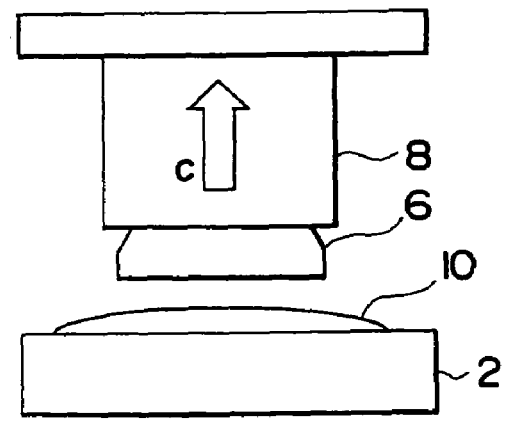
Figure 2A:
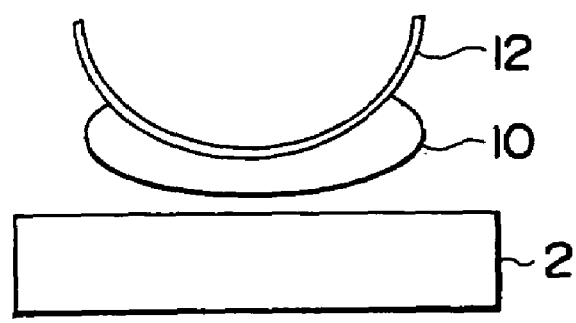
FIGS. 2A, 2B and 2C are diagrams showing a conventional bear-chip rework method.
Figure 2B:
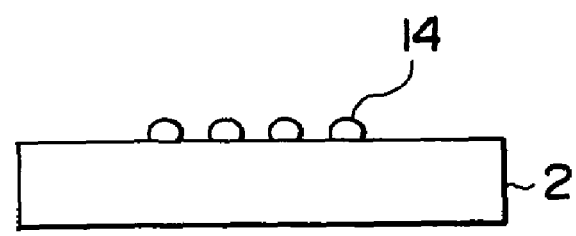
Figure 2C:
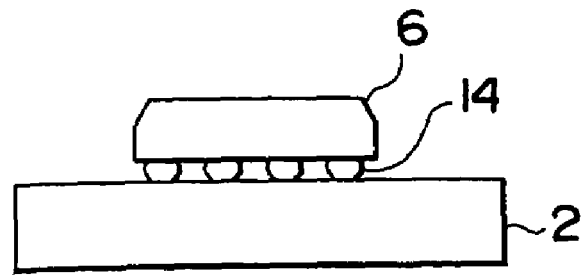
Figure 3:
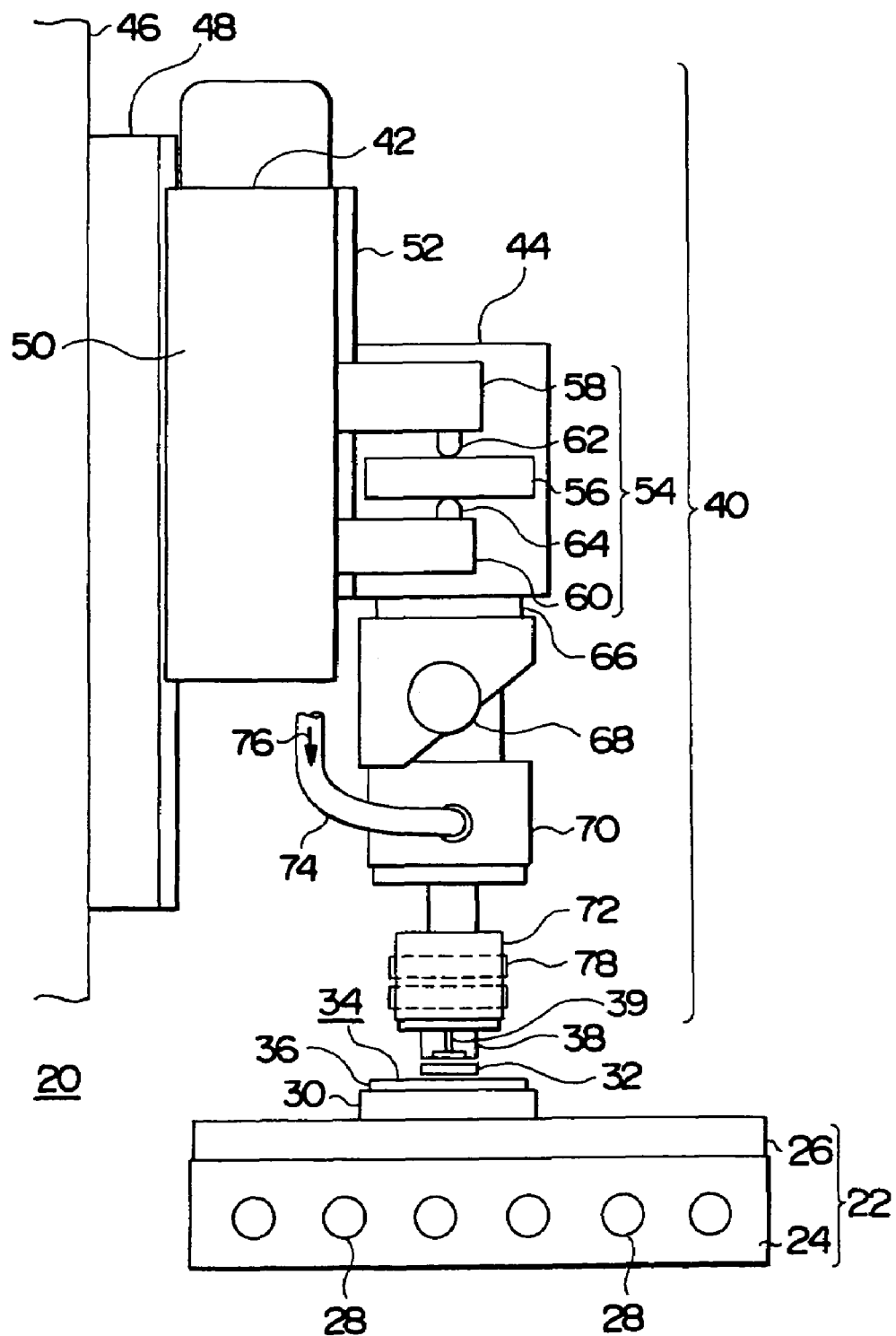
FIG. 3 is a diagram showing a bonding apparatus according to a first embodiment of the present invention.
Figure 4:
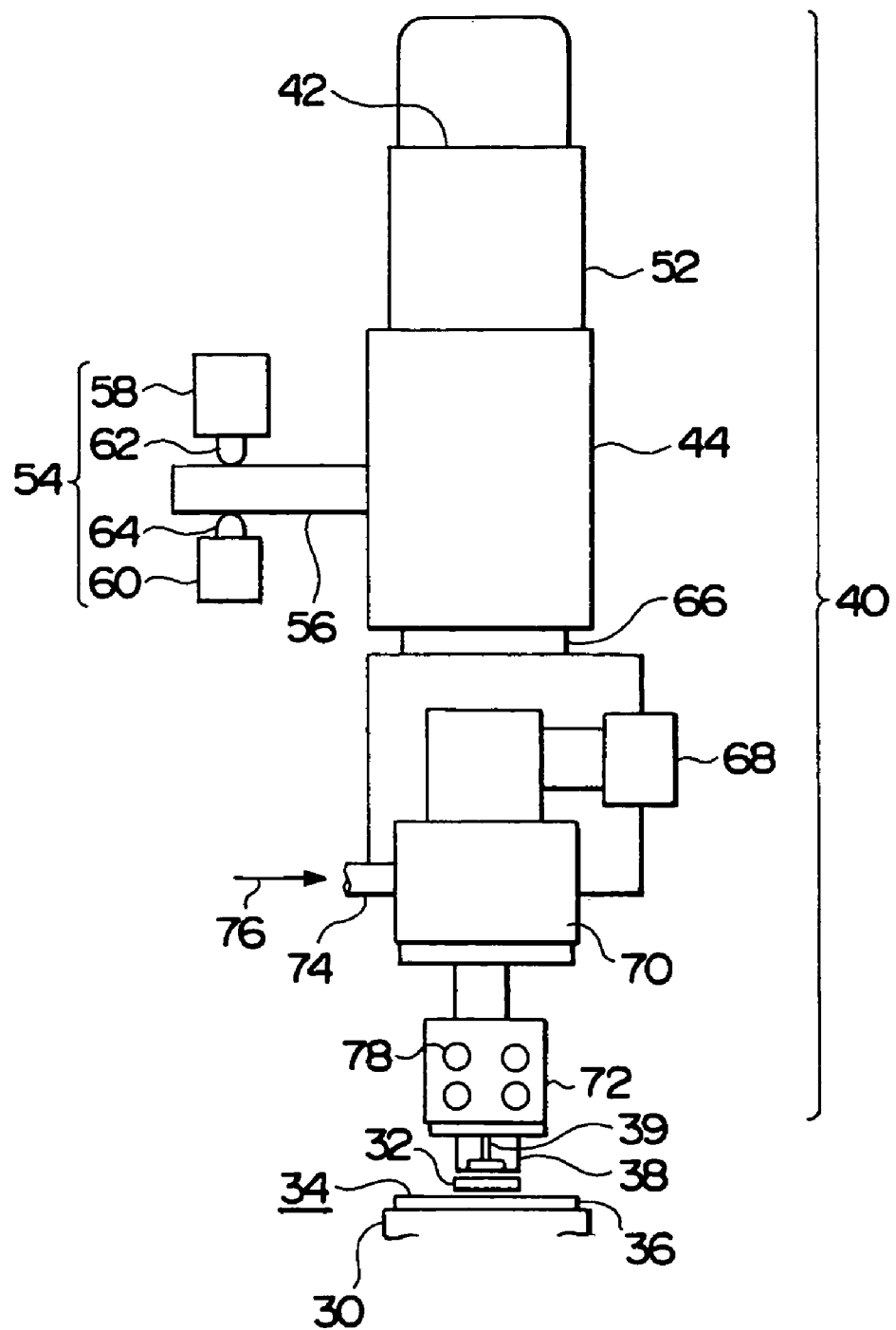
FIG. 4 is a diagram showing a configuration of a head unit of the bonding apparatus of FIG. 3.
Figure 5:
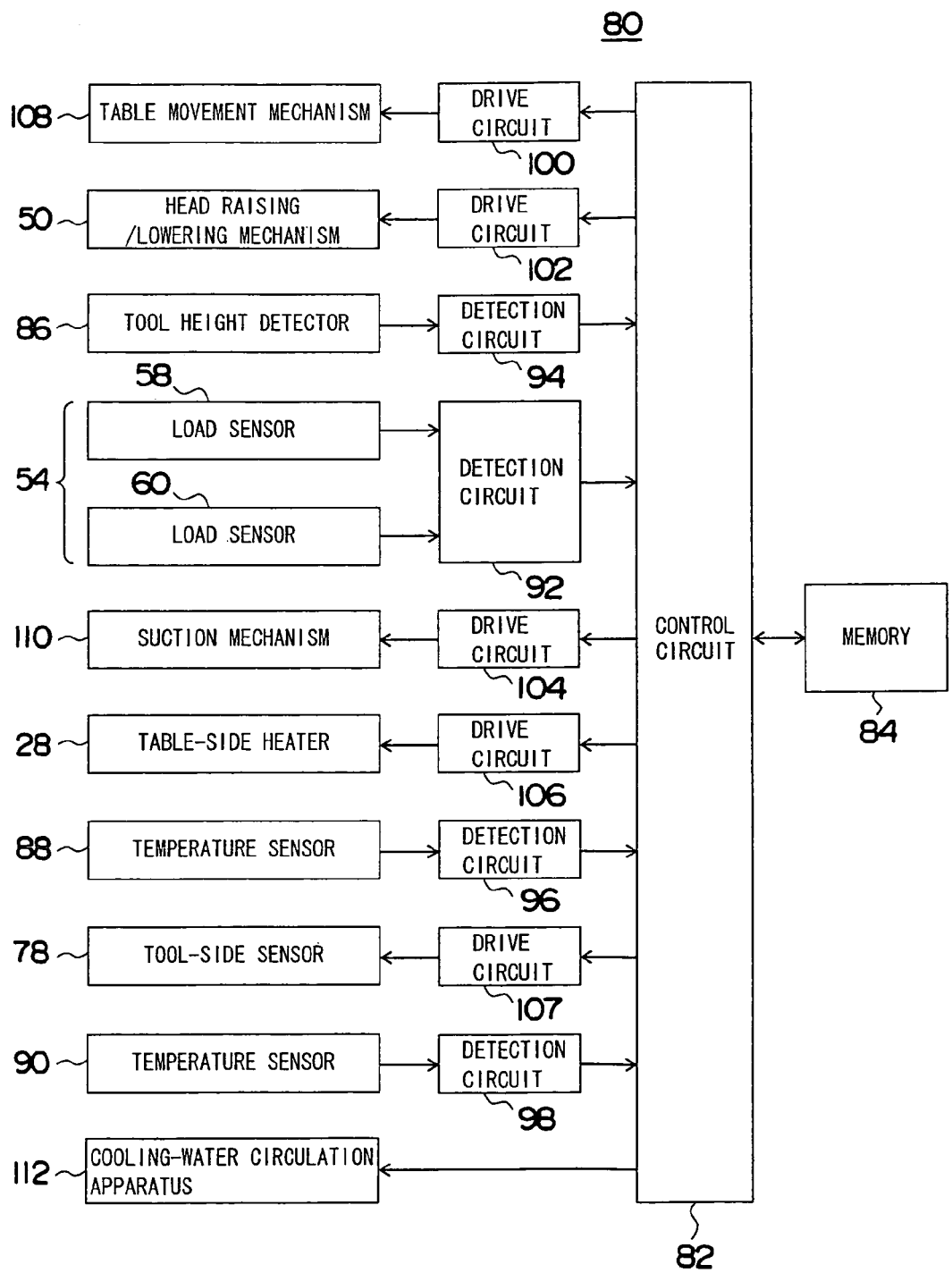
FIG. 5 is a diagram showing a configuration of a control apparatus of the bonding apparatus of FIG. 3.

A first embodiment of the present invention is described with reference to FIG. 3 to FIG. 5. FIG. 3 to FIG. 5 shows a bonding apparatus as an embodiment of a method and an apparatus for mounting and removing electronic components of the present invention; FIG. 3 is a side view showing a head unit and a control table; FIG. 4 is a front view of the head unit; and FIG. 5 is a block diagram showing a configuration of a control unit.

A bonding apparatus 20 is comprised of a control table 22 movable in the X and Y directions (e.g., horizontal direction); the control table 22 is comprised of, for example, a heating platform portion 24 and a package loading platform 26; and the heating platform portion 24 is comprised of a heater 28 as a first heating unit with in a chassis made up of corrosion resistant metal such as stainless steel. The package loading platform 26 is comprised of a flat loading surface made up of quartz glass. The package loading platform 26 is equipped with a package loading jig 30 and, onto the upper surface thereof, a bear chip 32 is mounted as an electronic component to be mounted, such as a semiconductor apparatus, e.g., LSI chip, a flip chip component or the like, or a substrate 36 is placed for a package 34 with the bear chip 32 mounted.

The bonding apparatus 20 is comprised of a chuck unit 38 as a bonding tool and the chuck unit 38 is a support member used for supporting, transporting and heating the bear chip 32. The chuck unit 38 is comprised of a suction path 39 in order to obtain adsorption power for supporting the bear chip. The chuck unit 38 is supported by a head unit 40 for raising and lowering the chuck unit 38 in the Z direction (e.g., vertical direction) and the head unit 40 is comprised of a first slider 42 for performing height control of the chuck unit 38 and a second slider 44 for supporting the chuck unit 38 as well as detecting a load applied to the chuck unit 38.

The slider 42 is slidably supported by a slide rail 48 provided on an apparatus body 46 and the height position thereof is controlled by a head raising/lowering mechanism 50 which is installed as a moving mechanism for moving the head unit 40 to any position. The head raising/lowering mechanism 50 is comprised of, for example, a ball screw rotated by a turning force of a motor or the like and is configured to raise and lower the slider 42 by converting the rotation of the ball screw into the raising and lowering force in the up and down direction.

The slider 44 is supported by a slide rail 52 provided on the slider 42 to be able to be raised and lowered as well as is supported by the slider 42 via a contact detection unit 54. The contact detection unit 54 indirectly detects contact between the bear chip 32 supported by the chuck unit 38 and the substrate 36 or contact between the chuck unit 38 and the bear chip 32 on the substrate, and in this embodiment, the contact detection unit 54 is configured such that a detection arm 56 protruded from the slider 44 is sandwiched between a load sensor 58 and a load sensor 60 installed on the top side and the under side thereof, respectively, to allow each detection element 62, 64 to contact with the top and under surface portions of the detection arm 56. Therefore, if the slider 44 is raised, a detected load of the load sensor 58 is increased while a detected load of the load sensor 60 is decreased, and if the slider 44 is lowered, a detected load of the load sensor 58 is decreased while a detected load of the load sensor 60 is increased. The load acting on the slider 44 and the direction thereof can be known from the detected loads of the load sensors 58, 60.

The slider 44 is provided with an angle ($\theta$) correction unit 66 and a tilt correction unit 68 as well as equipped with a heating unit 72 as a second heating unit for heating the head unit 38 side via a cooling unit 70, and the chuck unit 38 is supported on the under side of the heating unit 72. Cooling water 76 is circulated through the cooling unit 70 via a cooling water pipe 74 to constitute a thermal shield wall for blocking heat conduction of the heat of the heating unit 72 to the portion of the head unit 40 upper than the heating unit 72. The heating unit 72 is provided with a second heater 78 and the heat thereof can heat the chuck unit 38 and the bear chip 32 supported and contacted by the chuck unit 38. An angle ($\theta$) of the chuck unit 38 is corrected by the angle correction unit 66 in the horizontal direction and a tilt thereof is corrected by the tilt correction unit 68.

Also, the bonding apparatus 20 is comprised of, for example, a control unit 80 shown in FIG. 5 as a control apparatus. The control unit 80 performs various controls such as the movement of the control table 22, the raising and lowering of the head unit 40, the adsorption and release of the bear chip on the chuck unit 38, the heating control of the heaters 28, 78. Therefore, the control unit 80 is comprised of a control circuit 82 constituted by CPU (Central Processing unit) and the like, and the control circuit 82 is connected with a memory 84 for storing control information. Also, the control circuit 82 is supplied with the detected loads of the load sensors 58, 60 of the contact detection unit 54, detected heights of a tool height detector 86 and detected temperatures of temperature sensors 88, 90 through detection circuits 92, 94, 96 and 98. The tool height detector 86 is configured by, for example, installing an encoder to the ball screw of the head raising/lowering mechanism 50 for raising and lowering the head unit 40 and detects a height position from the rotation of the encoder. Therefore, the tool height detector 86 detects the height position of the chuck unit 38 raised and lowered by the head raising/lowering mechanism 50 and a change in the thermal expansion thereof. The control output from the control circuit 82 is supplied from drive circuits 100, 102, 104, 106 and 107 to a table movement mechanism 108, the head raising/lowering mechanism 50, a suction mechanism 110 and the heaters 28, 78. The table movement mechanism 108 moves in the X and Y directions the control table 22 movable in the X and Y directions. The suction mechanism 110 applies adsorption power for supporting the bear chip 32 to the chuck unit 38 by sucking through the suction path 39. A cooling-water circulation apparatus 112 circulates the cooling water 76 through the cooling unit 70 and the control circuit 82 performs the circulation control as well as controls the temperature of the cooling water 76. Other cooling mediums may be circulated instead of the cooling water 76.

In this bonding apparatus 20, the chuck unit 38 is a bonding tool equipped on the head unit 40 and can be raised and lowered by the head raising/lowering mechanism 50 and, for the position movement of the chuck unit 38 as well as the heating temperatures of the heater 28 as the heating unit on the control table 22 side and the heater 78 of the heating unit 72 on the head unit 40 side, the raising and lowering rate and the heating rate can be controlled in a synchronized manner or can be controlled independently.

When the load sensors 58, 60 of the contact detection unit 54 detect the contact position between the chuck unit 38 and the package 34 placed on the control table 22 and the detected position is defined as an original point where a preheating temperature HTk is raised to a maximum heating temperature HTm, a movement amount of the head unit 40, i.e., a total amount of thermal expansion can be detected by the tool height detector 86 from, for example, thermal deformation of the package 34 and thermal deformation of the chuck unit 38 of the head unit 40 and the like as thermal expansion of the portion upper then the bonding portion and thermal expansion of the portion lower then the bonding portion, which is stored into the memory 84 as head correction movement amount information. This head correction movement amount is changed by heating temperatures such as the preheating temperature and the maximum heating temperature as well as changed by the size and material of the substrate and the bear chip 32, and is information which is set independently.

Also, in this bonding apparatus, the mounting height of the bear chip 32 is measured in advance relative to the substrate 36 loaded on the package loading jig 30 of the control table 22, and the height position is detected by the tool height detector 86 and is stored into the memory 84 as mounting height information.

Then, in the bonding apparatus 20, the chuck unit 38 is lowered; an original point is defined as a contact position of the chuck unit 38 and the package 34 or a contact position of the bear chip 32 held by the chuck unit 38 and the substrate; the chuck unit 38 is moved while conforming the raising rate of the heating temperature to the moving rate of the chuck unit 38; the movement of the chuck unit 38 is stopped at a top dead center, i.e., a movement limiting point which is a position of the maximum heating temperature HTm; and after retaining at that position for a predetermined time period, the chuck unit 38 or the bear chip 32 held by the chuck unit 38 can be lowered to the mounding height relative to the substrate 36. Such controls are performed in the mounting and remounting processing of the bear chip 32 and the remove processing for removing the bear chip 32 from the package 34 as well as the replace processing.

In this way, according to the bonding apparatus 20, one can perform the reflow processing (mounting) of the bear chip 32 to the substrate 36, the remove processing (removing) of the bear chip 32 mounted on the substrate, and the rework processing (remounting) of the bear chip 32 to a position where the bear chip 32 has been removed from the substrate 36.

Second Embodiment

Figure 6:
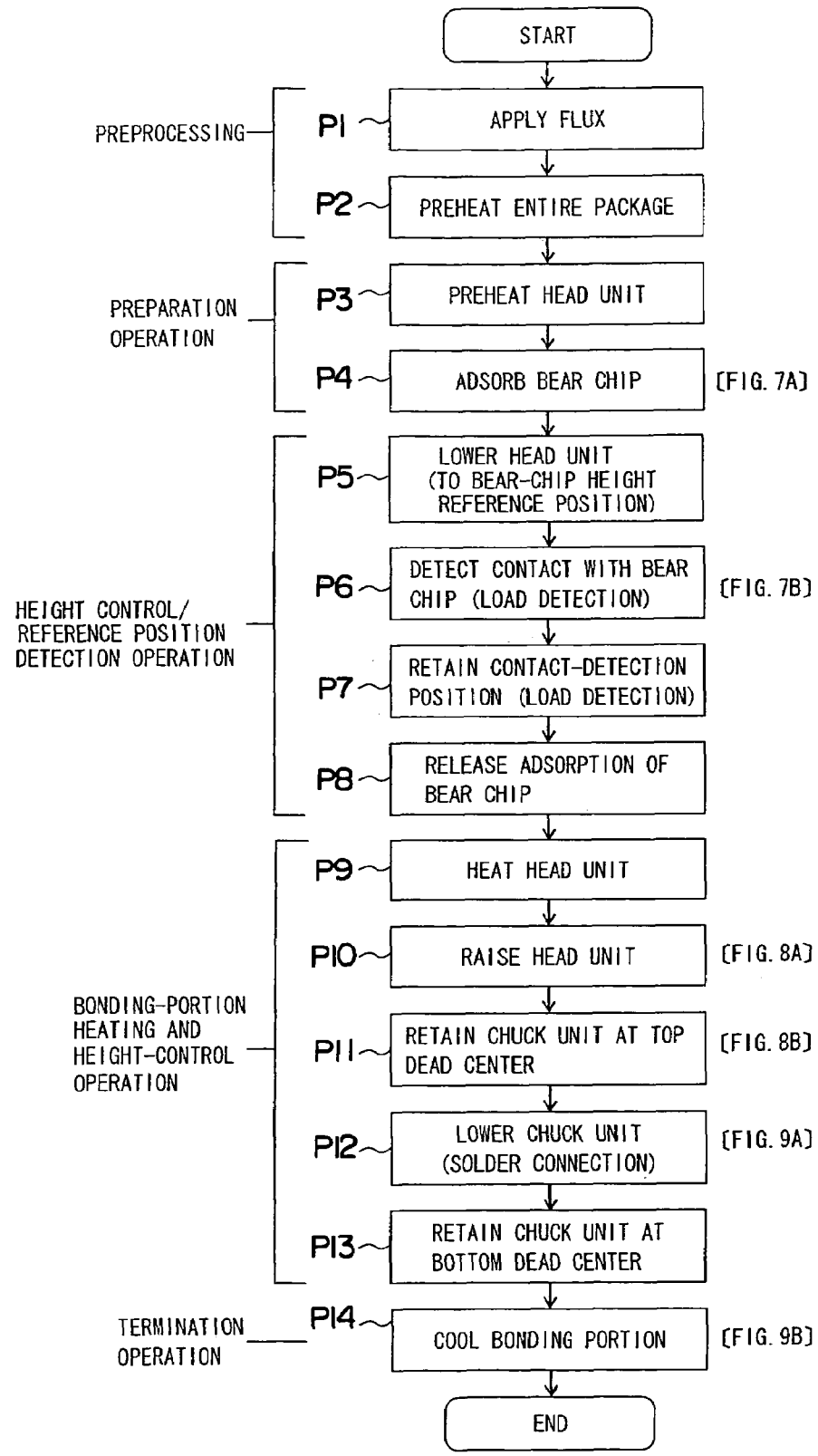
FIG. 6 is a process chart showing bear-chip reflow processing according to a second embodiment of the present invention.

Then, as a method for mounting electronic components which is a second embodiment of the present invention, the reflow processing is described with reference to FIG. 6 to FIGS. 9A and 9B. FIG. 6 is a process chart showing an operation sequence of the reflow processing, and FIGS. 7A and 7B to FIGS. 9A and 9B are diagrams showing an operation sequence.

The reflow processing is constituted by preprocessing, a preparation operation, a height control/reference position detection operation, a bonding-portion heating and height-control operation, and a termination operation. In prepro-cessing, flux is applied to the bear chip 32 (process P1) and the entire package 34 is preheated (process P2). In this case, the flux is applied to the entire area of the solder bump connection portion of the bear chip 32 and the package 34 is preheated by heating the control table 22. In this preheating, in order to reduce thermal distortion due to difference in temperature, the preheating temperature HTk is set to a constant temperature, for example, about 150° C.

Figure 7A:
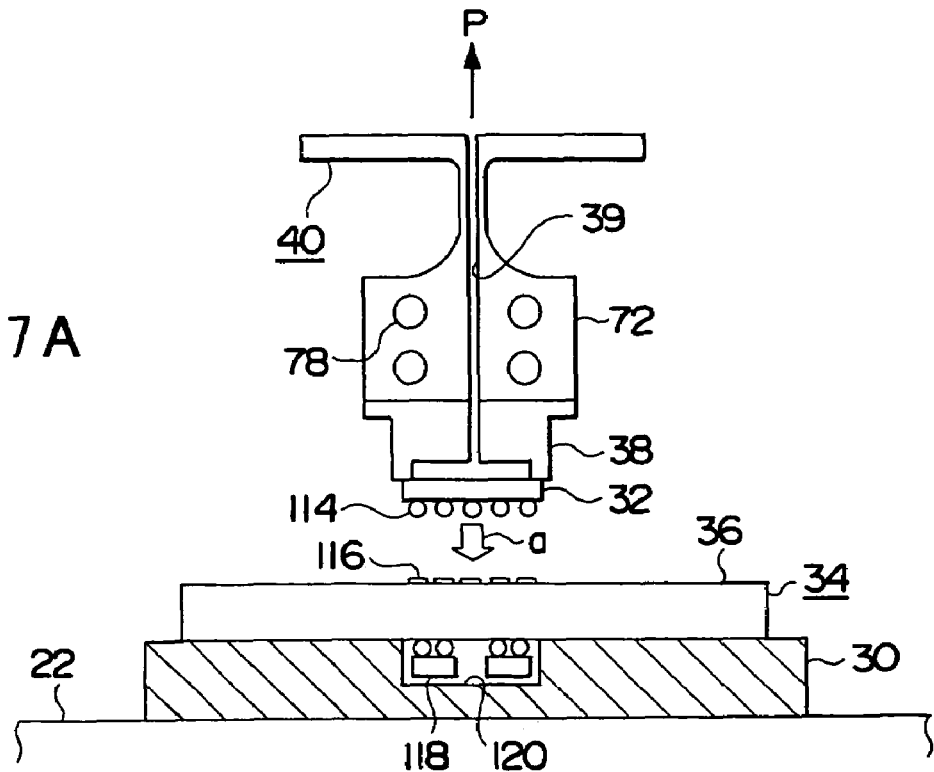
FIGS. 7A and 7B are diagrams showing adsorption, lowering and contact detection of a bear chip in the bear-chip reflow processing of FIG. 6.

In the preparation operation, preheating of the head unit 40 (process P3) and adsorption of the bear chip 32 of the chuck unit 38 (process P4) are performed. In the preheating, in order to eliminate thermal variation due to the contact between the chuck unit 38 and the package 34 to perform stable height detection by heating the heating unit 72 of the head unit 40 and by heating the chuck unit 38 with the heating unit 72, the heating temperature of the chuck unit 38 is set to the same temperature as the preheating temperature HTk of the package 34. Then, the bear chip 32 is adsorbed to the chuck unit 38 by vacuum adsorption of the suction mechanism 110, as shown in FIG. 7A, for example. In this case, although an electronic component 118 and the like are mounted onto the back surface of the substrate 36 of the package 34, the substrate 36 is horizontally maintained, because a concave portion 120 is formed for offsetting protruded potions of the electronic component 118 and the like in the package loading jig 30.

Figure 7B:
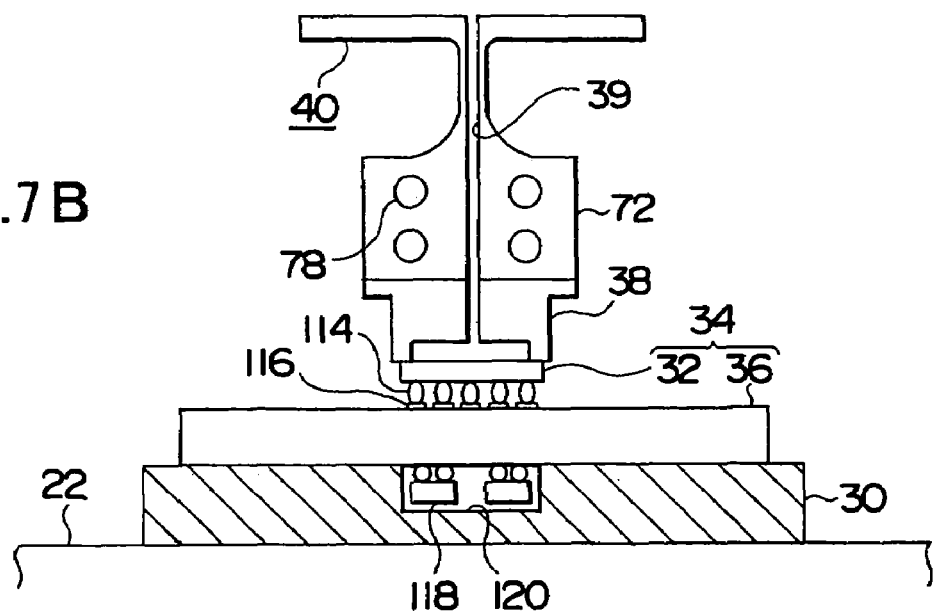

The height control/reference position detection operation performs lowering of the head unit 40 (process P5), detection of contact with the bear chip 32 (process P6), retention of the bear chip 32 at the contact detection position (process P7) and release of the adsorption of the bear chip 32 (process P8). As shown in FIG. 7A, the chuck unit 38 adsorbing the bear chip 32 is lowered toward the substrate 36 as shown by an arrow a at a high speed, stopped after being lowered to a predetermined height position, and then lowered at a low speed from this position until load detection is performed to detect a reference position for the head height control (process P6). As shown in FIG. 7B, when the bonding portion 116 of the substrate 36 is contacted with the solder bumps 114 of the bear chip 32 lowered at a low speed, the detected loads of the load sensors 58, 60 are changed as a result of the load on the head unit 40 side acting on the substrate 36. In this case, the detected load of the load sensor 58 is increased and the detected load of the load sensor 60 is decreased. As a result, a contact position of the bear chip 32 is detected and this contact position is defined as the reference position. In this case, by retaining the same load as the load at the time of this contact detection for a certain time, e.g., about 10 seconds, the contact state of the bear chip 32 and substrate 36 is maintained to generate heat transfer, and the same temperature is achieved on the package 34 side and the chuck unit 38 side of the head unit 40 for stabilization of the reference position. After such retention of the load, the adsorption of the bear chip 32 is released. By releasing the adsorption at this timing, a self-alignment effect is enhanced between the solder bumps 114 of the bear chip 32 and the bonding portion and the solder bumps 114 are prevented from being pressed and flattened.

Figure 8A:
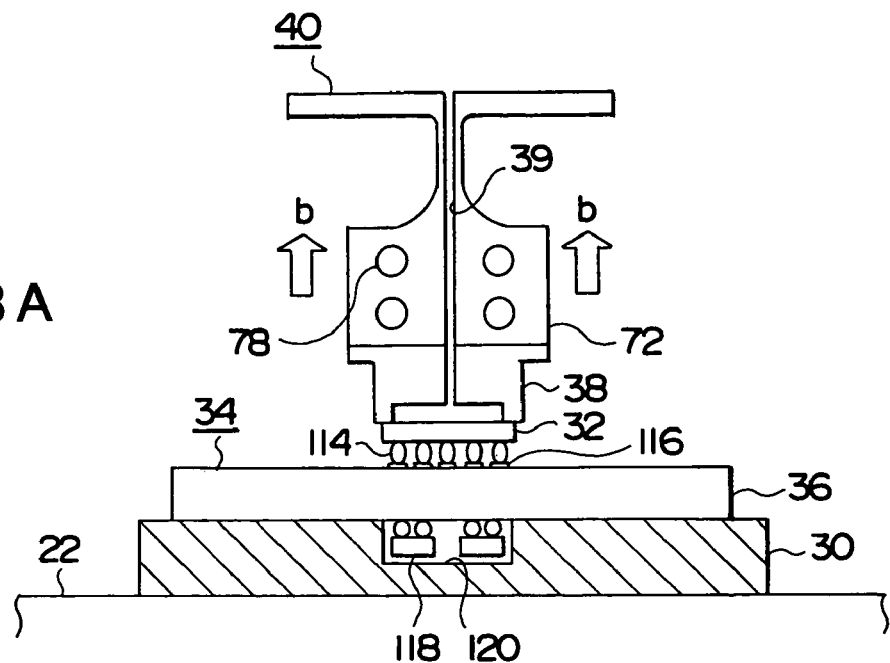
FIGS. 8A and 8B are diagrams showing rising of the head unit and retention of the head unit at a top dead center in the bear-chip reflow processing of FIG. 6.
Figure 8B:
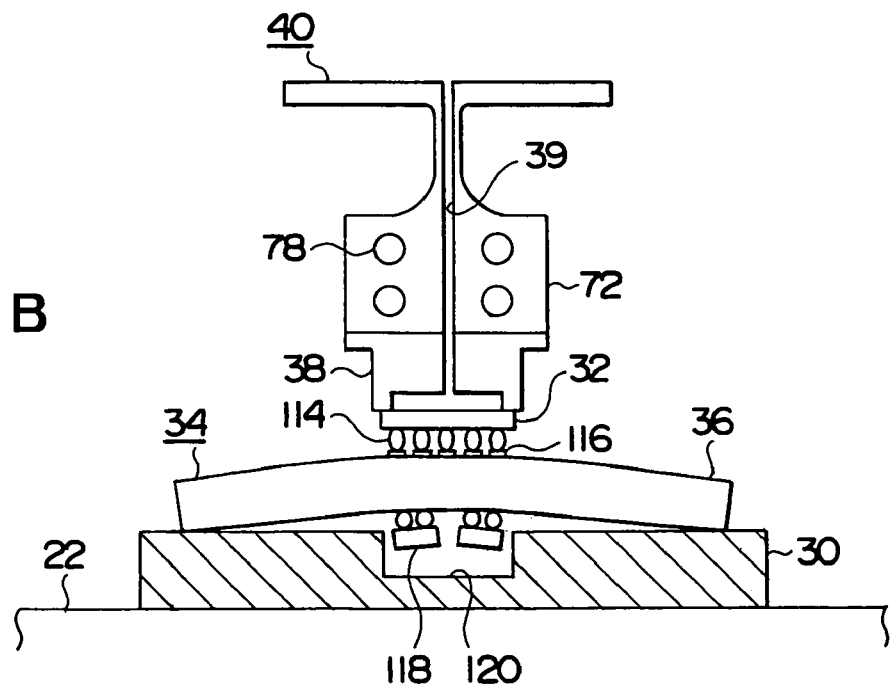
Figure 9A:
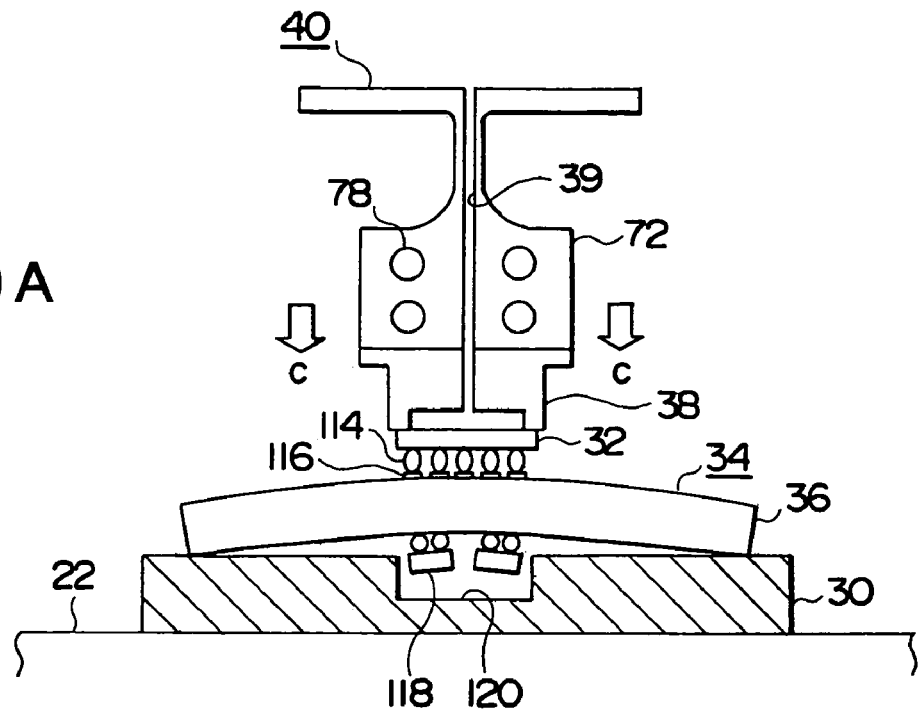
FIGS. 9A and 9B are diagrams showing lowering and rising of the head unit in the bear-chip reflow processing of FIG. 6.
Figure 9B:
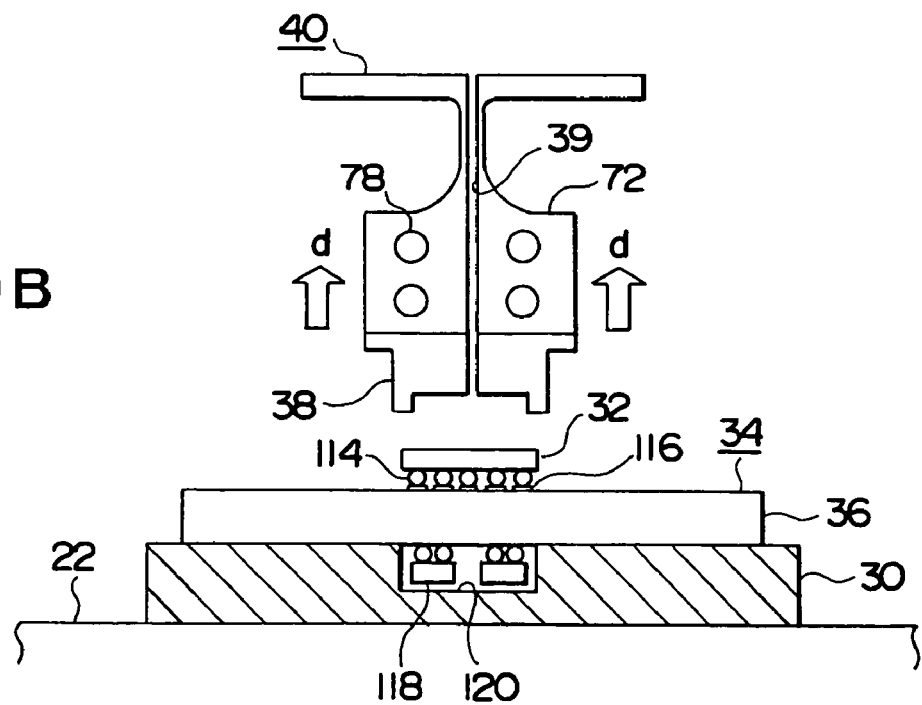

The bonding-portion heating and height-control operation performs heating of the head unit 40 (process P9), raising of the head unit 40 (process P10), retention of the chuck unit 38 at a top dead center (process P11), lowering of the chuck unit 38 (process P12) and retention of the chuck unit 38 at a bottom dead center (process P13). After releasing the adsorption of the bear chip 32, the head unit 40 is heated by the heater 78 to raise the temperature of the chuck unit 38 to a solder bonding temperature (process P9). In this heating control, the temperature is raised stably to enable thermal expansion and time control of the package 34, the head unit 40 and the like. In this case, the head unit 40 is raised as shown by an arrow b of FIG. 8A in synchronization with the temperature rising rate of the head unit 40, and in this case, as shown in FIG. 8B, the head unit 40 is raised to the height position equivalent to the amount of the thermal expansion of the heated portion. According to such control, a heating loss can be constrained as a result of maintaining the contact state of the solder bumps 114 of the bear chip 32 and the bonding portion 116 of the package 34.

Then, the head unit 40 is retained at the top dead center. In other words, the head unit 40 is retained at a maximum position of the rising temperature (i.e., the top dead center), and the solder can be certainly melted by defining the retention time period as a time period which can absorb variations of the temperature control. After this retention, the head unit 40 raised using the thermal expansion amount of each portion as a correction amount is lowered as shown by an arrow c of FIG. 9A (process P12). In this case, a correction amount is calculated which can absorb various variations in the Z direction such as heights of the solder bumps 114, and after the head unit 40 is lowered by that correction amount, the chuck unit 38 is retained at the bottom dead center or is retained for a predetermined time at a position after the corrected lowering to perform solder bonding. By retaining the chuck unit 38 at the bottom dead center for a predetermined time, the solder bonding is certainly performed.

In the termination operation, cooling of the bonding portion (process P14) is performed. After completing the solder bonding, as shown by an arrow d of FIG. 9B, the head unit 40 is raised to air-cool the solder at the bonding portion 116. This air-cooling is continued until the temperature of the solder at the bonding portion 116 is reduced to the solidification temperature of the solder and the reflow processing is completed. The package 34 completed with the reflow processing is conveyed along with the package loading jig 30.

Then, for the reflow processing, the raising/lowering and temperature control of the head unit 40 are described with reference to FIG. 10. In FIG. 10, a horizontal axis represents elapse of the time t; a vertical axis represents transitions of temperature and the head unit 40; L1 indicates the raising/lowering operation of the head unit 40 (chuck unit 38); L2 indicates the temperature control of the head unit 40; L3 indicates the thermal expansion amount due to the heating of the upper portion side of the bonding portion 116; and L4 indicates the thermal expansion amount due to the heating of the lower portion side of the bonding portion 116.

From a time point to when the preprocessing and the preparation operation described above is completed, the head unit 40 is lowered, and when the bear chip 32 adsorbed at the chuck unit 38 is contacted with the bonding portion 116 of the substrate 36 (time point $T_1$), this position is defined as a reference position. Time $T_1$ is a lowering time until the head unit 40 arrives at the reference position ms. From the time point t1 to a time point $t_2$, the head unit 40 is retained at the reference position ms, and the preheating temperature HTk of the package 34 is maintained at the same temperature as the temperature of the bear chip 32. Time $T_2$ is a retention time at the same load, and the retention of the bear chip 32 is released during this time $T_2$. In this case, Time $T_2$ is a retention time during when the head unit 40 is maintained at the preheating temperature HTk (e.g., 150° C.).

After the predetermined time ($T_2$) elapses at the reference position, the heating of the head unit 40 is started from the time point $t_2$, and in synchronization with this temperature rising rate, the head unit 40 is raised to the top dead center (time point $t_2$) mr (e.g., a height position of 50 μm, using ms as a reference position) which is a limiting point of the correction movement. Due to the heating of the head unit 40, the upper and lower portion sides of the bonding portion 116 are expanded by the heating and the expansion amount is dependent on the heating temperature. In this case, Time $T_4$ from the time point $t_2$ to a time point $t_3$ is a temperature rising time as well as a raising time of the head unit 40, and the length of the Time $T_4$ is set such that the contact is maintained between the solder bump 114 of the bear chip 32 and the bonding portion 116 of the substrate in consideration of thermal expansion, and the length of the Time $T_4$ determines the moving rate of the head unit 40. In this case, the correction movement amount Am is a movement amount for raising the head unit 40 by a total amount of the thermal expansion, and the maximum heating temperature HTm is achieved in the heat unit 40 at the time point $T_3$ when the heat unit 40 is moved by the correction movement amount Am or the time point $T_3$ when the heat unit 40 arrives at the top dead center mr.

A certain time $T_5$ from this time point $T_3$ to a time point t4 is defined as a waiting period, and the head unit 40 is retained at the top dead center. The temperature of the solder attains the melting point before the time point T3 is reached, and the solder is certainly melted during the time $T_5$. After the waiting time $T_5$ elapses, during time $T_6$ from the time point $t_4$ to a time point $t_5$, the head unit 40 is lowered from the top dead center mr to the bottom dead center mf (e.g., a height position of −10 μm, using ms as a reference position) by a correction movement amount Δn. The correction movement amount An is a movement amount for lowering the bear chip 32 to a mounting height necessary and sufficient for contact. In this case, the mounting height can be controlled to any height. The maximum heating temperature of the head unit 40 is maintained only during time $t_7$ from the time point $t_3$ to a time point $t_6$. After arriving at the bottom dead center at the time point $t_5$, the head unit 40 is retained for time $T_8$ from the time point $t_5$ to a time point $t_7$ and the head unit 40 is raised from the time point $t_7$, preparing for next processing. The heating temperature of the head unit 40 is reduced from the time point $t_6$ to the preheating temperature HTk during time $T_9$ from the time point $T_6$ to a time point $t_8$. Concurrently with such reduction of the heating temperature, the thermal expansion amounts on the upper and lower portion sides of the bonding portion 116 is reduced to the amounts at the time of the preheating temperature HTk.

Then, for the reflow processing, the temperature control and the raising/lowering control of the head unit 40 is described with reference to FIGS. 11A and 11B. FIG. 11A shows a contact state of the bear chip 32 and the bonding portion 116 of the substrate 36 at the time of the lowering of the head unit 40 and FIG. 11B shows a contact state of the bear chip 32 and the bonding portion 116 of the substrate 36 at the time of the correction raising movement of the head unit 40.

As shown in FIG. 11A, when the head unit 40 is lowered to position the solder bumps 114 of the bear chip 32 adsorbed and supported by the chuck unit 38 to be contacted with the bonding portion 116 of the substrate 36, the preheating temperature of the substrate 36 can be matched with the heating temperature of the chuck unit 88 side, and at this point in time, the adsorption of the bear chip 32 is released.

By heating from this preheated state to make the heating temperature to the maximum heating temperature HTm, the thermal expansion amounts on the upper and lower portion sides of the bonding portion 116 are increased correspondingly to the rising temperature. Therefore, in consideration of the thermal expansion, the temperature rising time is conformed such that the contact is maintained between the bear chip 32 and the chuck unit 38 which is a bonding tool. The temperature rising time ($T_4$) is conformed to a displacement amount depending on the thermal expansion due to the heating temperature from the preheating temperature at the time of contact and to the solder bonding temperature, and the head unit 40 is raised using the displacement amount as the correction movement amount Δm. With this operation, since the contact state is always maintained between the bear chip 32 and the chuck unit 38 for conducting heat, a heat conduction loss is planned to be prevented, and the heat is supplied efficiently and stably to the bonding portion 116 side as well as the position control of the bear chip 32 is performed.

Then, the bear chip 32 is lowered again along with the head unit 40 which has the temperature raised to the maximum heating temperature HTm at the top dead center, and by setting this movement amount as the correction movement amount Δn, the bear chip 32 is controlled to a necessary and sufficient position for the mounting height as well as the solder connection of the solder is performed between the solder bumps 114 and the bonding portion 116.

Figure 12A:
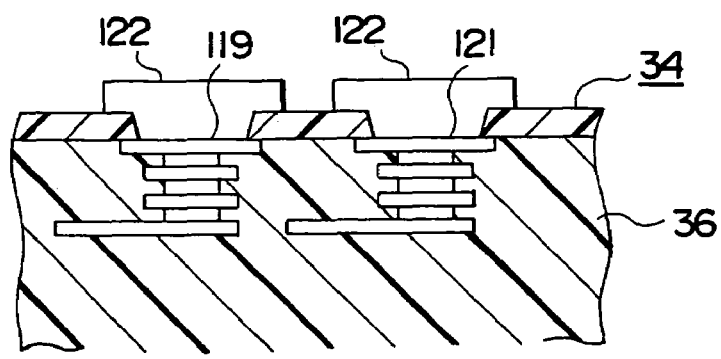
FIGS. 12A, 12B and 12C are diagrams showing reflow processing.
Figure 12B:
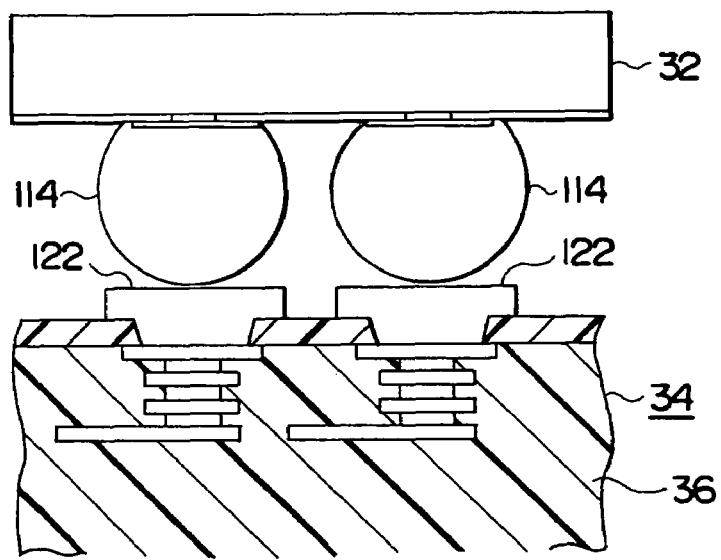
Figure 12C:
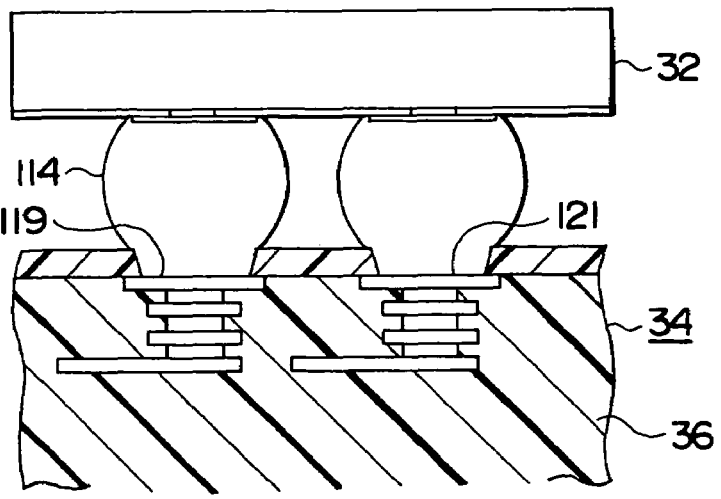

Then, this reflow processing is described with reference to FIGS. 12A to 12C. FIGS. 12A to 12C show preliminary solder processing, a positioning contact and bonding.

In FIG. 12A showing a state before initial mounting, preliminary solder 122 is formed on exposed surfaces of connection conductors formed on the substrate and the surfaces of the preliminary solder 122 is flattened by flattening processing. After heating to the preliminary temperature HTk in this state, the spherical solder bumps 114 is formed on the bear chip 32 as shown in FIG. 12B; the solder bumps 114 of the bear chip 32 are heated to the preliminary temperature HTk; the bear chip 32 is positioned for making the solder bumps 114 contact with the preliminary solder 122 to maintain at the same preliminary temperature HTk. After maintaining at the preliminary temperature HTk, as described above; when the bear chip 32 is heated to the maximum heating temperature HTm, the solder bumps 114 and the preliminary solder 122 is melted, and after the height position of the bear chip 32 is raised by the correction movement amount Δm corresponding to thermal deformation of the substrate 36 and thermal deformation of the head unit 40 side, when the bear chip 32 is lowered to the optimum mounting position, as shown in FIG. 12C, the preliminary solder 12 on the substrate 36 and the solder bumps 114 are integrated, and the bear chip 32 is mounted on the optimum height position on the substrate 36.

Third Embodiment

Figure 13:
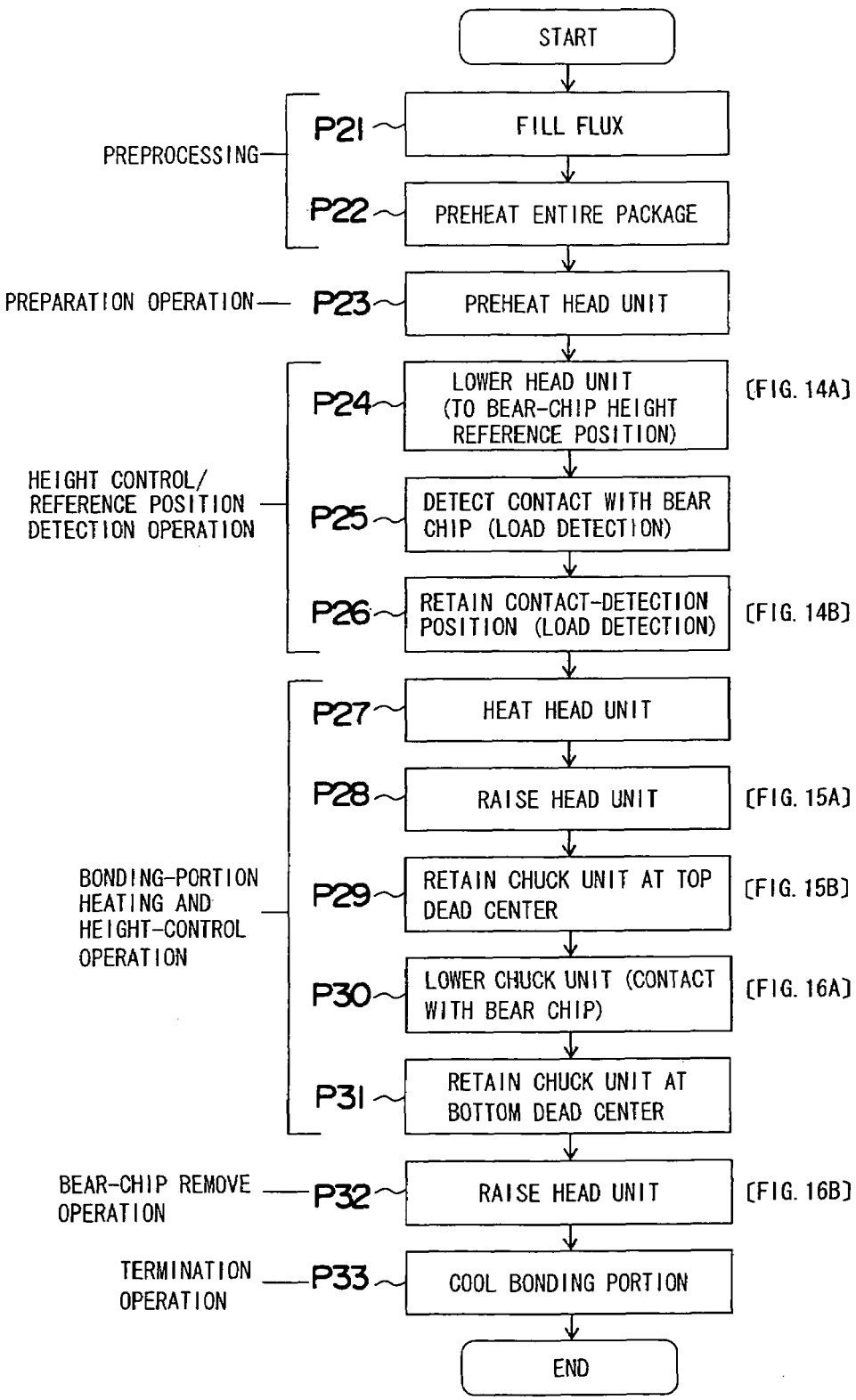
FIG. 13 is a process chart showing bear-chip remove processing according to a third embodiment of the present invention.

Then, a third embodiment of the present invention, i.e., a method for removing electronic components is described with reference to FIG. 13 to FIGS. 16A and 16B. FIG. 13 is a process chart showing an operation sequence of remove processing and FIGS. 14A and 14B to FIGS. 16A and 16B are diagrams showing an operation of the head unit 40.

The remove processing is constituted by preprocessing, a preparation operation, a height control/reference position detection operation, a bear-chip remove operation, and a termination operation. In preprocessing, filling with flux (process P21) and preheating of the entire package 34 (process P22) are performed. The entire connection portion of the solder bumps 114 of the bear chip 32 is filled with the flux utilizing a capillary phenomenon (process P21) and, at this point, preheating the package 34 facilitates the filling with the flux. The package is preheated by heating the control table 22 and, in this preheating, in order to reduce thermal distortion due to difference in temperature, the preheating temperature is set to a constant temperature, for example, about 150° C. as is the case with the reflow processing.

In the preparation operation, preheating of the head unit 40 (process P23) is performed. In the preheating, in order to eliminate thermal variation due to the contact between the chuck unit 38 and the package 34 to perform stable height detection by heating the heating unit 72 of the head unit 40 and by heating the chuck unit 38 with the heating unit 72, the heating temperature of the chuck unit 38 is set to the same temperature as the preheating temperature of the package 34.

Figure 14A:
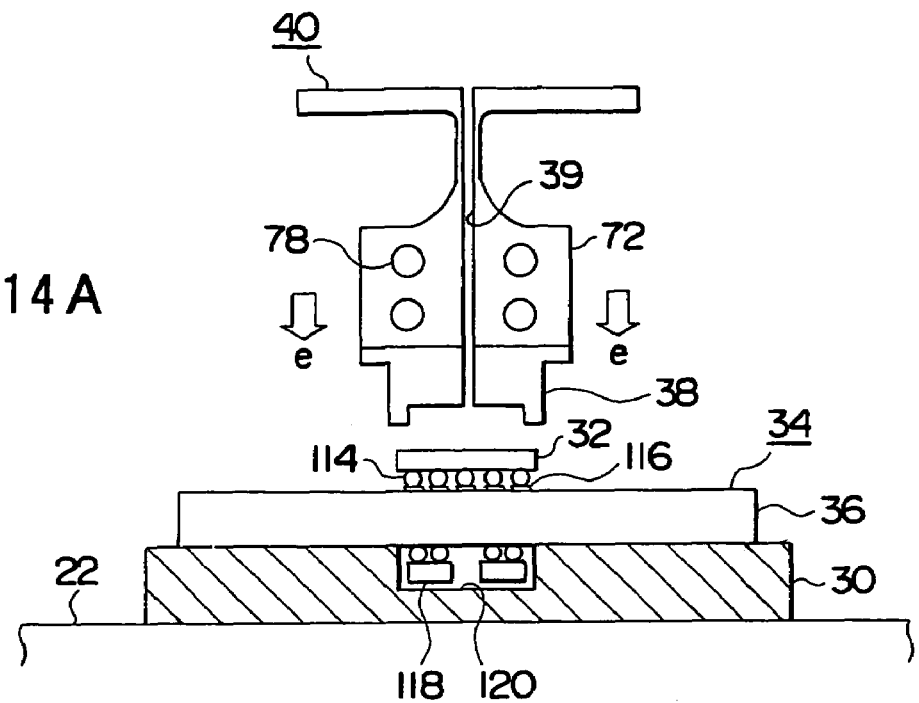
FIGS. 14A and 14B are diagrams showing lowering and contact detection of the head unit in the bear-chip remove processing of FIG. 13.
Figure 14B:
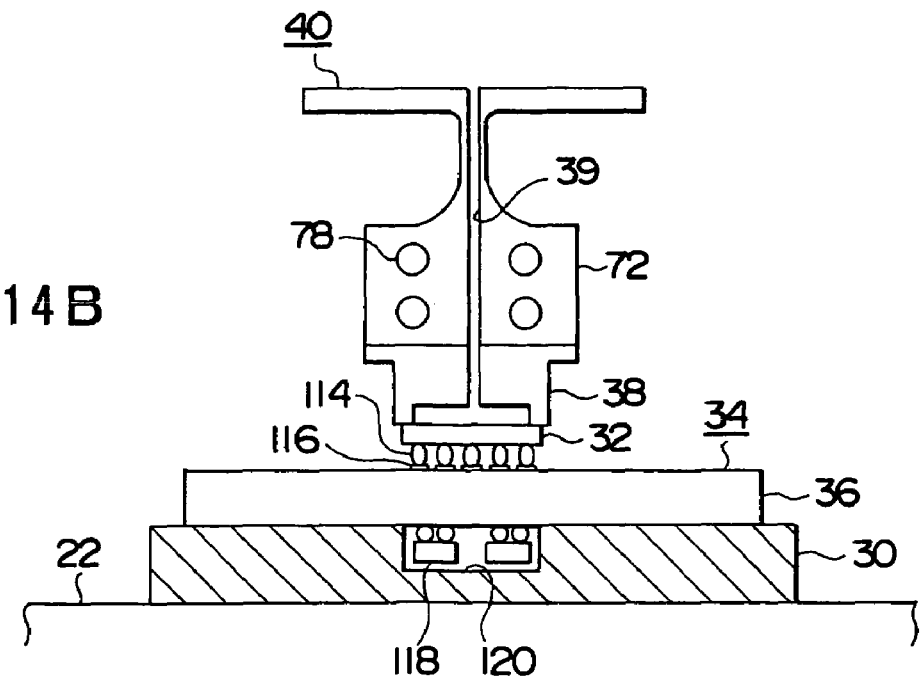

The height control/reference position detection operation performs lowering of the head unit 40 (process P24), detection of contact with the bear chip 32 (process P25) and retention at the contact detection position (process P26). As shown in FIG. 14A, the chuck unit 38 of the head unit 40 is lowered toward a reference position with a height of the bear chip 32 as shown by an arrow e at a high speed, stopped once, and then lowered at a low speed from this position until load detection is performed to detect contact with the bear chip 32 (process P25). As shown in FIG. 14B, when the chuck unit 38 lowered at a low speed contacts with the bear chip 32 on the substrate 36, the detected loads of the load sensors 58, 60 are changed as a result of the load on the head unit 40 side acting on the substrate 36 side. In this case, the detected load of the load sensor 58 is increased and the detected load of the load sensor 60 is decreased. As a result, a contact position of the bear chip 32 is detected and this contact position is defined as the reference position. In this case, by retaining the same load as the load at the time of this contact detection for a certain time, e.g., about 10 seconds, the contact state of the bear chip 32 and chuck unit 38 is maintained to generate heat transfer, and the same temperature is achieved on the package 34 side and the chuck unit 38 side of the head unit 40 for stabilization of the reference position.

Figure 15A:
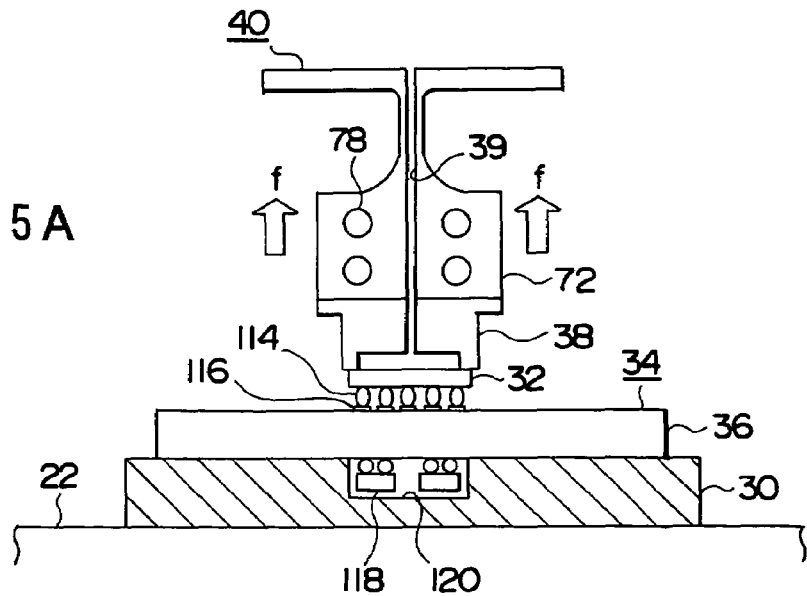
FIGS. 15A and 15B are diagrams showing rising of the head unit and retention of the head unit at a top dead center in the bear-chip remove processing of FIG. 13.
Figure 15B:
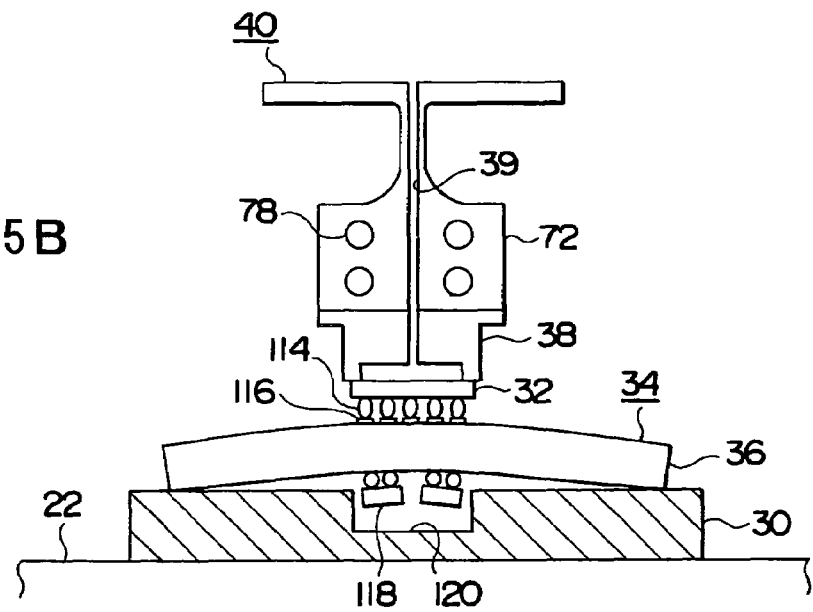

The bonding-portion heating and height-control operation performs heating of the head unit 40 (process P27), raising of the head unit 40 (process P28), retention of the chuck unit 38 at a top dead center (process P29), lowering of the chuck unit 38 (process P30) and retention of the chuck unit 38 at a bottom dead center (process P31). After the bear chip 32 is contacted with the chuck unit 38, the head unit 40 is heated by the heater 78 to raise the temperature of the chuck unit 38 to a solder bonding (melting) temperature (process P27). In this heating control, the temperature is raised stably to enable thermal expansion and time control of the package 34, the head unit 40 and the like. In this case, the head unit 40 is raised as shown by an arrow f of FIG. 15A in synchronization with the temperature rising rate of the head unit 40, and in this case, as shown in FIG. 15B, the head unit 40 is raised to the height position equivalent to the amount of the thermal expansion of the heated portion. According to such control, a heating loss can be constrained as a result of maintaining the contact state of the solder bumps 114 of the bear chip 32 and the bonding portion 116 of the package 34.

Then, the head unit 40 is retained at the top dead center. In other words, the head unit 40 is retained at a maximum position of the rising temperature (i.e., the top dead center), and the solder can be certainly melted by defining the retention time period as a time period which can absorb variations of the temperature control. After this retention, the head unit 40 raised using the thermal expansion amount of each portion as a correction amount is lowered as shown by an arrow g of FIG. 16A (process P30). In this case, a correction amount is calculated which can absorb various variations in the Z direction such as heights of the solder bumps 114, and after the head unit 40 is lowered by that correction amount the chuck unit 38 is retained at the bottom dead center or is retained for a predetermined time at a position after the corrected lowering to melt the solder (process P31). By retaining the head unit 40 at the bottom dead center for a predetermined time, the solder is certainly melted.

Figure 16A:
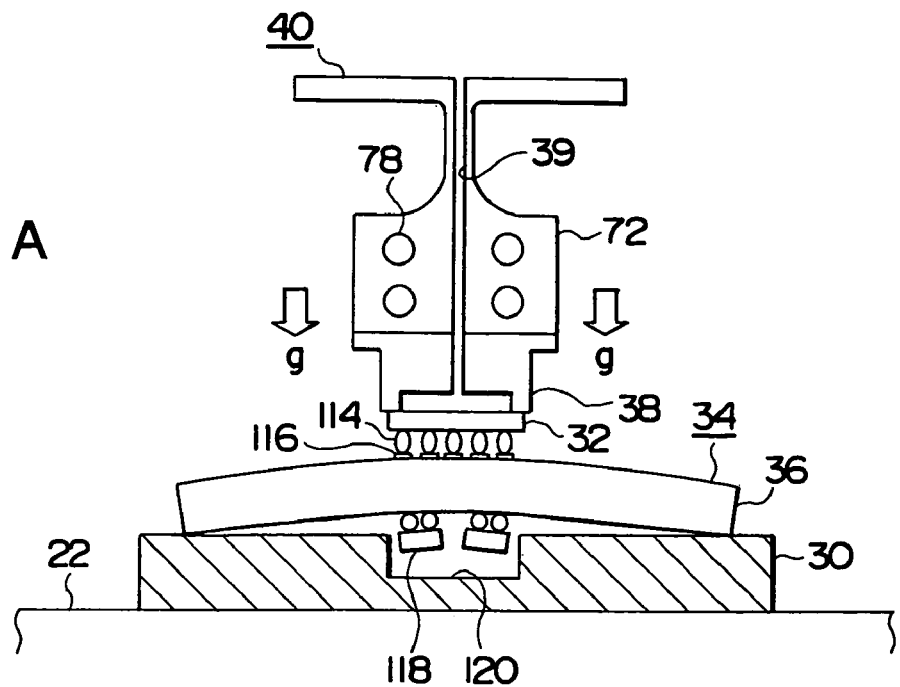
FIGS. 16A and 16B are diagrams showing lowering and rising of the head unit in the bear-chip remove processing of FIG. 13.
Figure 16B:
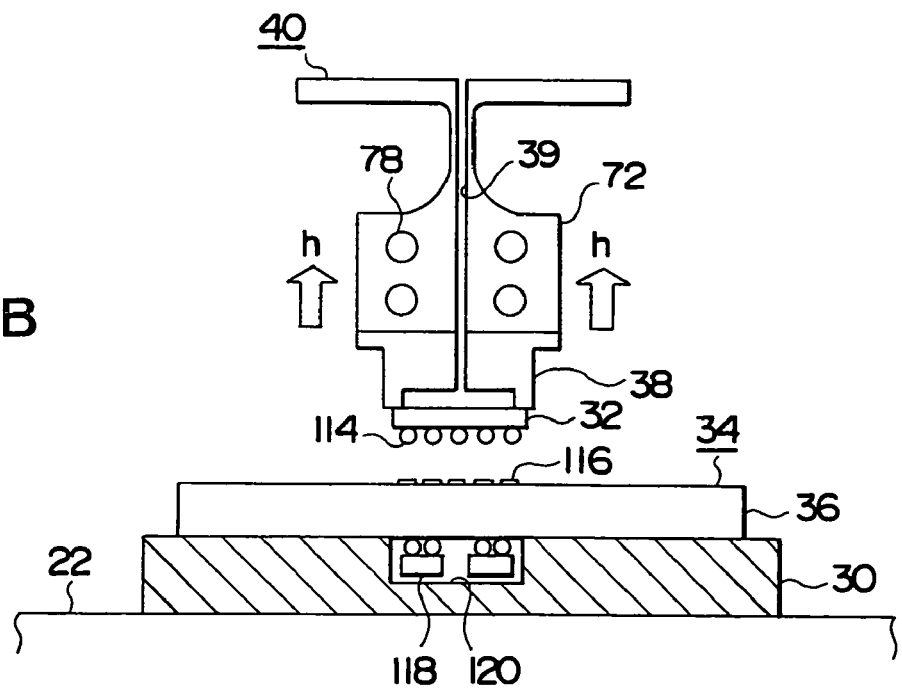

In the bear-chip remove operation of the bear chip 32, the raising of the head unit 40 (process P32) is performed. In other words, from the position after the head unit 40 is lowered by the corrected amount, the bear chip 32 is adsorbed by applying adsorption power to the chuck unit 38 through the suction mechanism 110 and then, by raising the head unit 40 in the direction indicated by an arrow h as shown in FIG. 16B, the bear chip 32 is removed from the package 32.

In the termination operation, cooling of the bonding portion 116 (process P33) is performed. The bonding portion 116 of the substrate 36 is air-cooled after the bear chip 32 is removed. This air-cooling is continued until the temperature of the solder of the bonding portion 116 is reduced to the solder solidification temperature and the remove processing is completed. The package 34 completed with the remove processing is conveyed along with the package loading jig 30.

In this remove processing, the raising/lowering and temperature control of the head unit 40 are the same as the reflow processing shown in FIG. 10 and FIGS. 11A and 11B described above; in the remove processing, the head unit 40 is lowered along with the chuck unit 38 in the state without the bear chip 32; and the adsorption processing of the bear chip 32 is performed during time $T_3$ when the solder is in the melted state. Also, in FIG. 11B, the bear chip 32 is lowered again along with the head unit 40 which has the temperature raised to the maximum heating temperature HTm at the top dead center, and by setting this movement amount as the correction movement amount Δn, the solder is maintained in the melted state while the bear chip 32 is at a necessary and sufficient position for the mounting height. For the rest, the raising/lowering and temperature control of the head unit 40 are the same as the reflow processing.

Figure 17A:
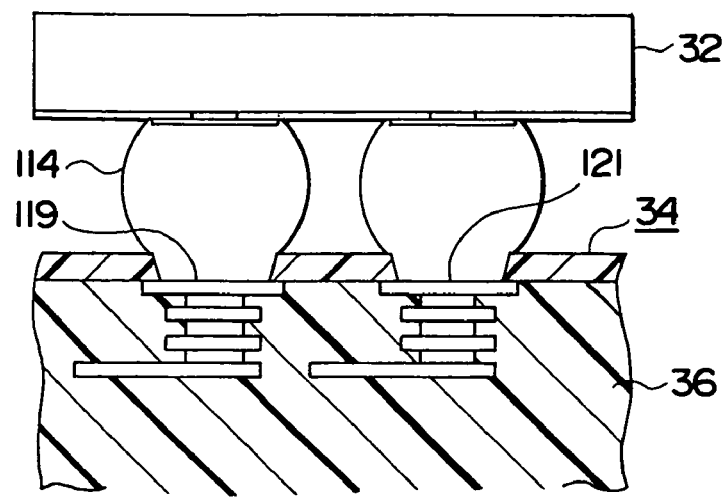
FIGS. 17A, 17B and 17C are diagrams showing remove processing.
Figure 17B:
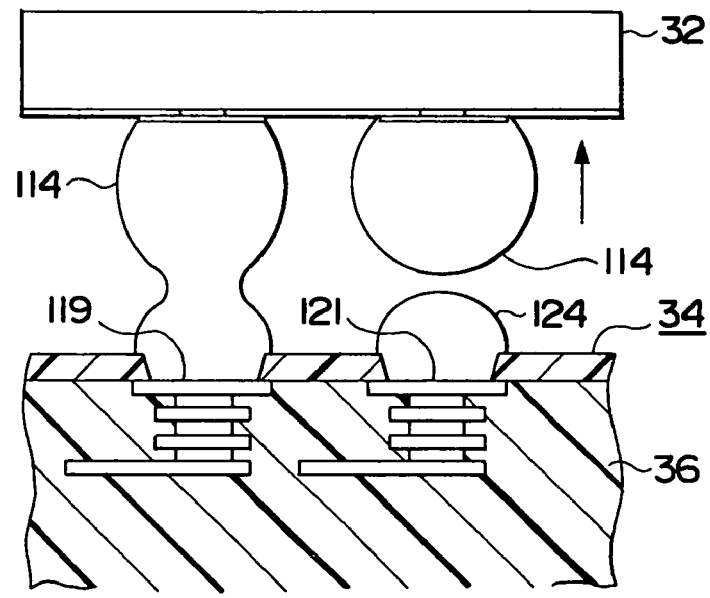
Figure 17C:
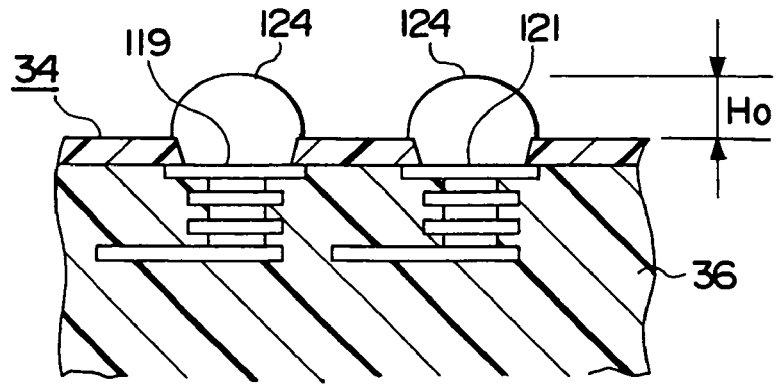

Then, this remove processing is described with reference to FIGS. 17A to 17C. FIGS. 17A to 17C show the remove processing of the bear chip and residual solder after the remove processing.

FIG. 17A shows a mounted state and the bear chip 32 is mounted on connection conductors 119, 121 formed on the substrate 36. When the heating is performed in this state from the preliminary temperature HTk to the maximum heating temperature which is the solder melting temperature, the solder can be melted. In this solder-melting state, after the height position of the bear chip 32 is raised by the correction movement amount Δm corresponding to thermal deformation of the substrate and thermal deformation of the head unit 40 side and after the bear ship 32 is lowered to the optimum mounting position, when the head unit 40 is raised to remove the bear ship 32 as shown in FIG. 17B, residual solder 124 is formed on the substrate 36 as shown in FIG. 17C, and the residual solder 124 has hemispherical upper surface portions and is formed with a height (Ho) which is a constant height, e.g., about 40μ.

Fourth Embodiment

Figure 18A:
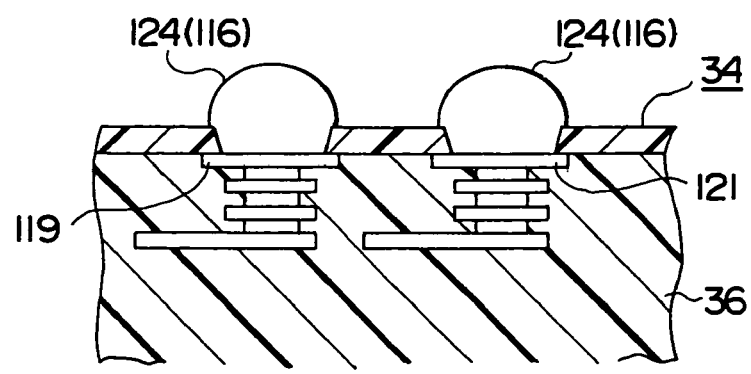
FIGS. 18A, 18B and 18C are diagrams showing reflow processing utilizing residual solder.
Figure 18B:
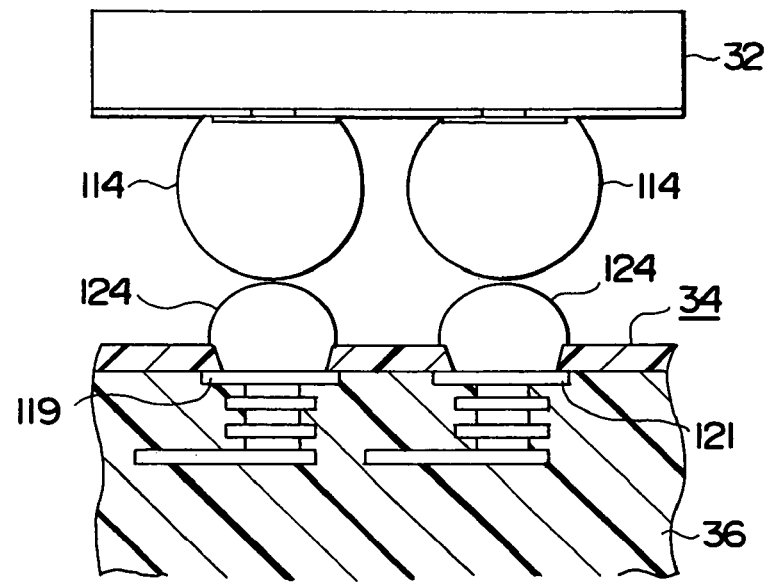

Then, a fourth embodiment of the present invention, i.e., a method for mounting electronic components is described with reference to FIGS. 18A to 18C. FIG. 18A shows a substrate after the remove processing; FIG. 18B shows rework processing of a bear chip; and FIG. 18C is a remounted state of the bear chip.

On the substrate 36 of the package 34, the bonding portion 116 is formed with residual solder 124 at a position to be connected to the bear chip 32 and the residual solder 124 has been formed by the remove processing described above. The rework processing of the bear chip 32 to the substrate 36 is performed as is the case with the reflow processing described above (FIG. 6 to FIGS. 12A to 12C). After applying flux to the bear chip 32 and after the bear chip 32 is preheated at the preheating temperature HTk as well as the substrate is preheated at that temperature, as shown in FIG. 18B, the bear chip 32 is positioned to the residual solder 124 of the substrate 36, and the solder bumps 114 and the residual solder 124 are maintained at the same preheating temperature HTk. After maintaining at the preheating temperature HTk for a given time, when the bear chip 32 is heated to raise the temperature to the maximum heating temperature HTm as described above, the solder bumps 114 and the residual solder 124 are melted, and after the height position of the bear chip 32 is raised by the correction movement amount Δm corresponding to thermal deformation of the substrate 36 and thermal deformation of the head unit 40 side, the bear chip 32 is lowered to the optimum mounting position, and the residual solder 124 on the substrate 36 is integrated with the solder bumps 114 as shown in FIG. 18C to remount the bear chip 32 at the optimum height position on the substrate 36.

Figure 18C:
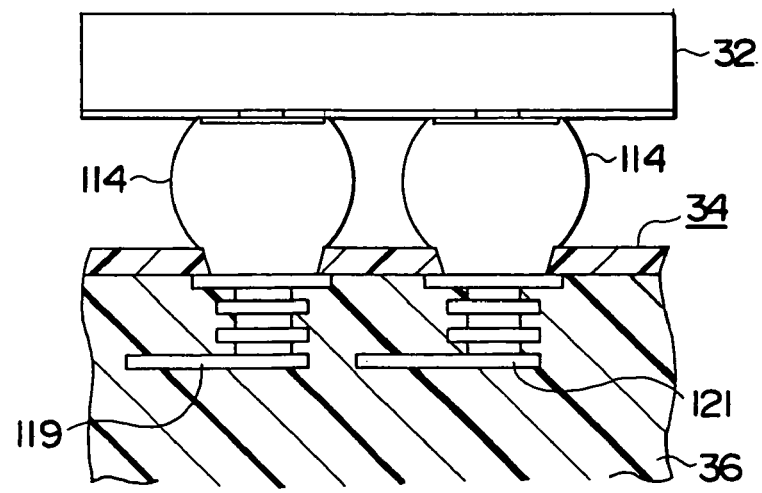
Figure 19A:
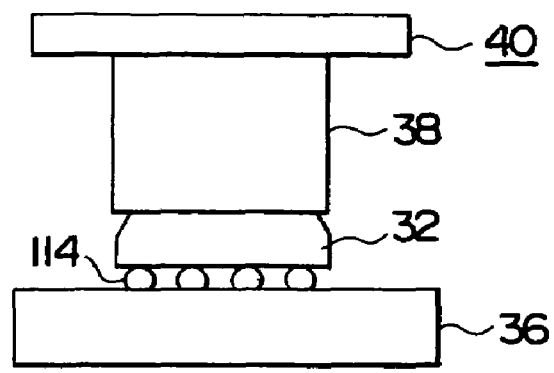
FIGS. 19A, 19B and 19C are diagrams showing rework processing.
Figure 19B:
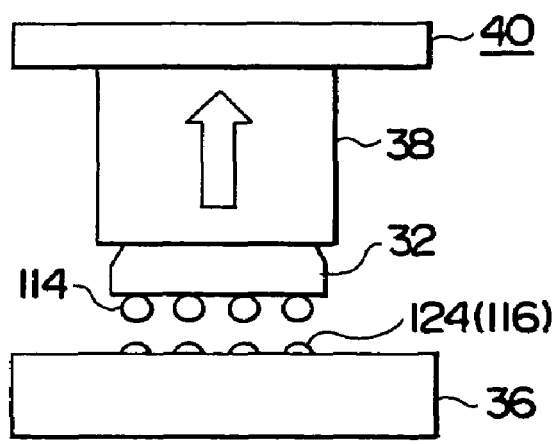
Figure 19C:
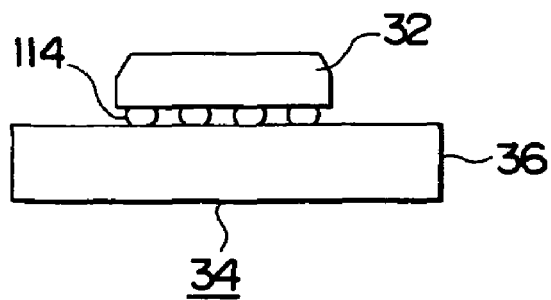

By sequentially performing the remove processing constituted by FIGS. 17A to 17C and the reflow processing of FIGS. 18B and 18C, processing can be performed for the mounting of the bear chip 32, the removing thereof and the replace or remount of the bear chip 32. For example, as shown in FIG. 19A, after the chuck unit 38 of the head unit 40 is contacted with the bear chip 32 mounted on the substrate 36 to be maintained at the preheating temperature HTk and after the heating to the heating temperature HTm, the bear chip 32 is removed from the substrate 36 as shown in FIG. 19B, and then, the bear chip 32 can be remounted on that substrate 36 by the similar processing to perform the rework processing of the bear chip 32.

Then, by extracting technical matters from the embodiments of the method and apparatus for mounting and removing electronic components of the present invention, the technical significance, modifications and other technical expansions thereof are listed as follows.

(1) As shown in the embodiments, in the mounting and removing processing, after the bear chip 32 or chuck unit 38 becomes the same temperature as the preheated temperature of the substrate 36, the position control is performed for the chuck unit 38 or the bear chip 32 supported by the chuck unit 38 with high accuracy, and when the preheated temperature HTk is shifted to the maximum heating temperature HTm, thermal distortion of each member is measured to determine the correction movement amount (Δm) under the conditions of the temperature desired for bonding. Then, positioning is performed while the preheating temperature of the substrate 36 is the same as the temperature of the bear chip 32 or chuck unit 38 of the head unit; by maintaining the contact state of the bear chip 32 and the substrate 36 for a predetermined time, e.g., about 10 seconds, the position of the head unit 40 is stabilized; and at this point, the position of the head unit 40 is defined as an original point of a head position. Then, in conformity with the temperature rising time $T_4$ from the preheating temperature HTk to the solder bonding temperature, i.e., the maximum heating temperature HTm, the head unit 40 or the chuck unit 38 is raised from the original position to the position of the correction amount limiting point as the top dead center. After waiting for the heating temperature to be stabilized and after the movement of the head unit 40 is completed, the solder melting state is achieved and the head unit 40 or the bare chip 32 is lowered to the theoretically ideal bonding height.

In this way, a series of the operation sequences is common to the remove processing and replace processing of the bear chip 32, and since the bonding solder material is finished in a spherical shape by filling the flux at the time of the remove, the replace processing can be performed without preprocessing. Therefore, if the position control is enabled at the time of the heating of the head, by measuring thermal expansion of members such as equipments and a substrate and by setting parameters for the position control, highly reliable C4 connection and detachment can be performed for the substrate 36 and the bear chip 32 with lower stresses and the rework processing can be performed for various electronic components such as the bear chip 32.

(2) In FIG. 10, the waiting time $T_5$ for retaining the chuck unit 38 or the bear chip 32 at the top dead center may be started from a solder melting start point before the time point $t_3$, in consideration of variations of the head movement speed and acceleration.

(3) Although the embodiments are described such that the waiting time $T_5$ is identical for the remove processing and the reflow or replace processing, in the case of the remove processing, the retention time at the top dead center may be set to one third of the case of the reflow or replace processing because of removal of the bear chip 32.

(4) Although the embodiments are described taking a bear chip as an example of an electronic component to be mounted or removed, the electronic component of the present invention encompasses various components such as semiconductor apparatuses soldered with the use of solder bumps, e.g., micro (C4) bumps, components equipped with semiconductor apparatuses, flip chip components and the like, and the present invention is not limited to the bear chip and the semiconductor apparatus illustrated in the embodiments.

Experimental Result

After raising a temperature to the maximum heating temperature HTm as well as raising the head unit 40, if the head unit 40 is lowered again for bonding, when the bear chip 32 has bumps with a pad diameter of 100 μm and a pad diameter of the substrate 36 is 90 μm, it has been confirmed that good bonding can be achieved by lowering 60 μm, provided that the bump pitch is 216 μm or more.

Also, when the bear chip 32 is removed by similar processing, 30 to 50 percent of solder is left on the substrate 36 as the residual solder 124, which can be utilized for replacing the bear chip 32 or reworking the package 34.

Although the most preferred embodiments of the present invention have been described hereinabove, the present invention is not limited to the description above and of course may be modified or changed by those skilled in the art based on the gist of the present invention as defined in the claims or disclosed in the description of the preferred embodiments, and it is needless to say that such modifications and changes are within the scope of the present invention.

What is claimed is:

1. A removing method for an electronic component that removes from a substrate an electronic component soldered to the substrate with the use of solder bumps, the removing method comprising:

moving a tool for receiving the electronic component to the electronic component on the substrate to detect contact of the tool, with the electronic component on the substrate;

raising a heating temperature of the tool, electronic component and the substrate up to a maximum heating temperature starting from the contact of the tool as well as moving the tool in response to the temperature rising;

moving the tool to a stopped position where the maximum heating temperature is achieved, such that the electronic component maintains contact with the substrate;

moving the electronic component from the stopped position where the maximum heating temperature is achieved to a mounting height of the substrate through movement of the tool so that the tool receives the electronic component from the substrate; and preheating the tool and the substrate before the tool contacts the electronic component, wherein the maximum heating temperature corresponds to thermal deformation of the substrate.

2. The removing method for an electronic component of claim 1, the stopped position of the tool is higher than the mounting height of the electronic component on the substrate, and wherein the electric component is moved from the stopped position to the mounting height of the substrate by use of the tool after the elapse of predetermined time.

3. The removing method for an electronic component of claim 1, wherein the amount of movement of the tool moved in response to the temperature rising is a value calculated from thermal distortion of the substrate and thermal distortion of support members supporting the electronic component.

4. The removing method for an electronic component of claim 1, wherein 30 to 50 percent of solder is left on the substrate with the electronic component removed.

5. A removing method for an electronic component that uses a tool to remove an electronic component soldered to a substrate, the removing method comprising:

raising a heating temperature of the tool, electronic component and the substrate up to a maximum heating temperature;

moving the tool to a stopped position where the maximum heating temperature is achieved, such that the electronic component maintains contact with the substrate;

moving the electronic component from the stopped position where the maximum heating temperature is achieved to a mounting height of the substrate through movement of the tool so that the tool receives the electronic component from the substrate; and preheating the tool and the substrate before the movement of the tool.

6. A removing method for an electronic component that uses a tool to remove an electronic component soldered to a substrate, the removing method comprising:

raising a heating temperature of the tool, electronic component and the substrate up to a maximum heating temperature;

moving the tool to a stopped position where the maximum heating temperature is achieved, such that the electronic component maintains contact with the substrate; and moving the electronic component from the stopped position to a mounting height of the substrate through movement of the tool so that the tool receives the electronic component from the substrate.

* * * * *

UNITED STATES PATENT AND TRADEMARK OFFICE
CERTIFICATE OF CORRECTION

| | |
|---|---|
| PATENT NO. | : 7,299,965 B2 |
| APPLICATION NO. | : 11/288279 |
| DATED | : November 27, 2007 |
| INVENTOR(S) | : Toshihisa Sato |

Page 1 of 1

It is certified that error appears in the above-identified patent and that said Letters Patent is hereby corrected as shown below:

Column 18, Line 18, change "tool," to --tool--.

Column 18, Line 38, after "claim 1," insert --wherein--.

Signed and Sealed this

Thirteenth Day of May, 2008

JON W. DUDAS
*Director of the United States Patent and Trademark Office*